(12) United States Patent
Rapp et al.

(10) Patent No.: US 7,676,649 B2
(45) Date of Patent: Mar. 9, 2010

(54) COMPUTING MACHINE WITH REDUNDANCY AND RELATED SYSTEMS AND METHODS

(75) Inventors: John Rapp, Manassas, VA (US);
Chandan Mathur, Manassas, VA (US);
Scott Hellenbach, Amissville, VA (US);
Mark Jones, Centreville, VA (US);
Joseph A. Capizzi, Sterling, VA (US)

(73) Assignee: Lockheed Martin Corporation, Bethesda, MD (US)

( * ) Notice: Subject to any disclaimer, the term of this patent is extended or adjusted under 35 U.S.C. 154(b) by 34 days.

(21) Appl. No.: 11/243,507

(22) Filed: Oct. 3, 2005

(65) Prior Publication Data
US 2006/0101253 A1 May 11, 2006

Related U.S. Application Data

(60) Provisional application No. 60/615,192, filed on Oct. 1, 2004, provisional application No. 60/615,157, filed on Oct. 1, 2004, provisional application No. 60/615,170, filed on Oct. 1, 2004, provisional application No. 60/615,158, filed on Oct. 1, 2004, provisional application No. 60/615,193, filed on Oct. 1, 2004, provisional application No. 60/615,050, filed on Oct. 1, 2004.

(51) Int. Cl.
*G06F 15/76* (2006.01)
*G06F 11/00* (2006.01)
*G06F 11/16* (2006.01)
*G06F 9/00* (2006.01)

(52) U.S. Cl. ............... 712/43; 712/228; 714/6; 714/10; 714/11

(58) Field of Classification Search ............. 712/228, 712/43; 714/2, 6, 10, 11, 13, 15, 12
See application file for complete search history.

(56) References Cited

U.S. PATENT DOCUMENTS 3,665,173 A * 5/1972 Bouricius et al. ............. 714/11

(Continued)

FOREIGN PATENT DOCUMENTS

AU 2003287317 6/2004

(Continued)

OTHER PUBLICATIONS

Salcic Z et al., "FLIX environment for generation of custom-configurable machines in FPLDs for embedded applications", Microprocessors and Microsystems, IPC Business Press Ltd. London, GB, vol. 23, No. 8-9, Dec. 15, 1999, pp. 513-526.

(Continued)

*Primary Examiner*—Aimee J Li
(74) *Attorney, Agent, or Firm*—Kevin D. Jablonski; Graybeal Jackson LLP

(57) ABSTRACT

According to an embodiment of the invention, a computing machine comprises a pipeline accelerator, a host processor coupled to the pipeline accelerator, and a redundant processor, a redundant pipeline unit, or both, coupled to the host processor and to the pipeline accelerator. The computing machine may also include a system-restore server and a system-restore bus that allow the machine to periodically save the machine states in case of a failure. Such a computing machine has a fault-tolerant scheme that is often more flexible than conventional schemes. For example, if the pipeline accelerator has more extra "space" than the host processor, then one can add to the computing machine one or more redundant pipeline units that can provide redundancy to both the pipeline and the host processor. Therefore, the computing machine can include redundancy for the host processor even though it has no redundant processing units.

19 Claims, 18 Drawing Sheets

U.S. PATENT DOCUMENTS

| | | | |
|---|---|---|---|
| 4,703,475 A | 10/1987 | Dretzka et al. | |
| 4,774,574 A | 9/1988 | Daly et al. | |
| 4,862,407 A | 8/1989 | Fette et al. | |
| 4,873,626 A | 10/1989 | Gifford | |
| 4,914,653 A | 4/1990 | Bishop et al. | |
| 4,956,771 A | 9/1990 | Neustaedter | |
| 4,985,832 A | 1/1991 | Grondalski | |
| 5,185,871 A | 2/1993 | Frey et al. | |
| 5,283,883 A | 2/1994 | Mishler | |
| 5,317,752 A * | 5/1994 | Jewett et al. | 714/14 |
| 5,339,413 A | 8/1994 | Koval et al. | |
| 5,377,333 A | 12/1994 | Nakagoshi et al. | |
| 5,544,067 A | 8/1996 | Rostoker et al. | |
| 5,583,964 A | 12/1996 | Wang | |
| 5,623,418 A | 4/1997 | Rostoker et al. | |
| 5,640,107 A | 6/1997 | Kruse | |
| 5,649,135 A | 7/1997 | Pechanek et al. | |
| 5,655,069 A | 8/1997 | Ogawara et al. | |
| 5,712,922 A | 1/1998 | Loewenthal et al. | |
| 5,752,071 A | 5/1998 | Tubbs et al. | |
| 5,784,636 A | 7/1998 | Rupp | |
| 5,801,958 A | 9/1998 | Dangelo et al. | |
| 5,867,399 A | 2/1999 | Rostoker et al. | |
| 5,892,962 A | 4/1999 | Cloutier | |
| 5,909,565 A | 6/1999 | Morikawa et al. | |
| 5,910,897 A | 6/1999 | Dangelo et al. | |
| 5,916,307 A * | 6/1999 | Piskiel et al. | 719/314 |
| 5,930,147 A | 7/1999 | Takei | |
| 5,931,959 A | 8/1999 | Kwiat | |
| 5,933,356 A | 8/1999 | Rostoker et al. | |
| 5,941,999 A * | 8/1999 | Matena et al. | 714/6 |
| 5,963,454 A | 10/1999 | Dockser et al. | |
| 5,978,578 A | 11/1999 | Azarya et al. | |
| 6,018,793 A | 1/2000 | Rao | |
| 6,023,742 A | 2/2000 | Ebeling et al. | |
| 6,028,939 A | 2/2000 | Yin | |
| 6,049,222 A | 4/2000 | Lawman | |
| 6,096,091 A | 8/2000 | Hartmann | |
| 6,108,693 A | 8/2000 | Tamura | |
| 6,112,288 A | 8/2000 | Ullner | |
| 6,128,755 A * | 10/2000 | Bello et al. | 714/715 |
| 6,192,384 B1 | 2/2001 | Dally et al. | |
| 6,205,516 B1 | 3/2001 | Usami | |
| 6,216,191 B1 | 4/2001 | Britton et al. | |
| 6,216,252 B1 | 4/2001 | Dangelo et al. | |
| 6,237,054 B1 | 5/2001 | Freitag, Jr. | |
| 6,247,118 B1 * | 6/2001 | Zumkehr et al. | 712/228 |
| 6,253,276 B1 | 6/2001 | Jeddeloh | |
| 6,282,627 B1 | 8/2001 | Wong et al. | |
| 6,308,311 B1 | 10/2001 | Carmichael et al. | |
| 6,324,678 B1 | 11/2001 | Dangelo et al. | |
| 6,326,806 B1 | 12/2001 | Fallside et al. | |
| 6,470,482 B1 | 10/2002 | Rostoker et al. | |
| 6,526,430 B1 | 2/2003 | Hung et al. | |
| 6,532,009 B1 | 3/2003 | Fox et al. | |
| 6,624,819 B1 | 9/2003 | Lewis | |
| 6,625,749 B1 * | 9/2003 | Quach | 714/10 |
| 6,662,285 B1 | 12/2003 | Douglass et al. | |
| 6,684,314 B1 | 1/2004 | Manter | |
| 6,704,816 B1 | 3/2004 | Burke | |
| 6,769,072 B1 | 7/2004 | Kawamura et al. | |
| 6,785,841 B2 * | 8/2004 | Akrout et al. | 714/11 |
| 6,785,842 B2 * | 8/2004 | Zumkehr et al. | 714/17 |
| 6,829,697 B1 | 12/2004 | Davis et al. | |
| 6,839,873 B1 | 1/2005 | Moore | |
| 6,915,502 B2 * | 7/2005 | Schott et al. | 716/16 |
| 6,982,976 B2 | 1/2006 | Galicki et al. | |
| 6,985,975 B1 | 1/2006 | Chamdani et al. | |
| 7,373,432 B2 | 1/2006 | Rapp et al. | |
| 7,024,654 B2 | 4/2006 | Bersch et al. | |
| 7,036,059 B1 * | 4/2006 | Carmichael et al. | 714/725 |
| 7,073,158 B2 | 7/2006 | McCubbrey | |
| 7,117,390 B1 | 10/2006 | Klarer et al. | |
| 7,134,047 B2 * | 11/2006 | Quach | 714/11 |
| 7,137,020 B2 | 11/2006 | Gilstrap et al. | |
| 7,177,310 B2 | 2/2007 | Ingaki et al. | |
| 7,228,520 B1 | 6/2007 | Keller et al. | |
| 7,284,225 B1 | 10/2007 | Ballagh et al. | |
| 7,386,704 B2 | 6/2008 | Schulz et al. | |
| 7,404,170 B2 * | 7/2008 | Schott et al. | 716/16 |
| 7,418,574 B2 * | 8/2008 | Mathur et al. | 712/15 |
| 7,487,302 B2 | 2/2009 | Gouldey et al. | |
| 2001/0014937 A1 | 8/2001 | Huppenthal et al. | |
| 2001/0025338 A1 * | 9/2001 | Zumkehr et al. | 712/228 |
| 2002/0018470 A1 | 2/2002 | Galicki et al. | |
| 2002/0041685 A1 | 4/2002 | McLoone et al. | |
| 2002/0087829 A1 | 7/2002 | Snyder et al. | |
| 2002/0112091 A1 * | 8/2002 | Schott et al. | 709/328 |
| 2002/0162086 A1 | 10/2002 | Morgan | |
| 2003/0009651 A1 | 1/2003 | Najam et al. | |
| 2003/0014627 A1 | 1/2003 | Krishna et al. | |
| 2003/0061409 A1 | 3/2003 | RuDusky | |
| 2003/0115500 A1 * | 6/2003 | Akrout et al. | 714/10 |
| 2003/0177223 A1 | 9/2003 | Erickson et al. | |
| 2003/0229877 A1 | 12/2003 | Bersch et al. | |
| 2003/0231649 A1 | 12/2003 | Awoseyi et al. | |
| 2004/0019771 A1 * | 1/2004 | Quach | 712/229 |
| 2004/0019883 A1 | 1/2004 | Banerjee et al. | |
| 2004/0045015 A1 | 3/2004 | Haji-Aghajani et al. | |
| 2004/0061147 A1 | 4/2004 | Fujita et al. | |
| 2004/0064198 A1 | 4/2004 | Reynolds et al. | |
| 2004/0123258 A1 * | 6/2004 | Butts | 716/5 |
| 2004/0130927 A1 | 7/2004 | Schulz et al. | |
| 2004/0133763 A1 | 7/2004 | Manthur et al. | |
| 2004/0136241 A1 | 7/2004 | Rapp et al. | |
| 2004/0153752 A1 | 8/2004 | Sutardja et al. | |
| 2004/0170070 A1 | 9/2004 | Rapp et al. | |
| 2004/0181621 A1 | 9/2004 | Manthur et al. | |
| 2005/0104743 A1 | 5/2005 | Ripolone et al. | |
| 2005/0149898 A1 | 7/2005 | Hakewill et al. | |
| 2006/0036774 A1 * | 2/2006 | Schott et al. | 709/251 |
| 2006/0085781 A1 | 4/2006 | Rapp et al. | |
| 2006/0087450 A1 | 4/2006 | Schulz et al. | |
| 2006/0101250 A1 | 5/2006 | Rapp et al. | |
| 2006/0101253 A1 | 5/2006 | Rapp et al. | |
| 2006/0101307 A1 | 5/2006 | Rapp et al. | |
| 2006/0123282 A1 | 6/2006 | Gouldey et al. | |
| 2006/0149920 A1 | 7/2006 | Rapp et al. | |
| 2006/0206850 A1 | 9/2006 | McCubbrey | |
| 2006/0230377 A1 | 10/2006 | Rapp et al. | |
| 2006/0236018 A1 | 10/2006 | Dao et al. | |
| 2007/0055907 A1 | 3/2007 | Sutardja et al. | |
| 2007/0271545 A1 | 11/2007 | Eng | |
| 2008/0222337 A1 | 9/2008 | Schulz et al. | |

FOREIGN PATENT DOCUMENTS

| | | |
|---|---|---|
| AU | 2003287318 | 6/2004 |
| AU | 2003287319 | 6/2004 |
| AU | 2003287320 | 6/2004 |
| AU | 2003287321 | 6/2004 |
| CA | 2503611 | 5/2004 |
| CA | 2503613 | 5/2004 |
| CA | 2503617 | 5/2004 |
| CA | 2503620 | 5/2004 |
| CA | 2503622 | 5/2004 |
| EP | 0694847 | 1/1996 |
| EP | 0161438 | 12/2000 |
| EP | 1061438 | 12/2000 |
| EP | 1061439 | 12/2000 |
| EP | 0945788 | 8/2004 |
| EP | 1559005 | 8/2005 |
| EP | 1570344 | 9/2005 |

| | | |
|---|---|---|
| EP | 1573514 | 9/2005 |
| EP | 1573515 | 9/2005 |
| EP | 1576471 | 9/2005 |
| JP | 05-108347 | 9/1991 |
| JP | 06-282432 | 3/1993 |
| JP | 2001-236496 | 8/2001 |
| JP | 2002-149424 | 5/2002 |
| JP | 2006515941 | 6/2006 |
| JP | 2006-518056 | 8/2006 |
| JP | 2006518057 | 8/2006 |
| JP | 2006518058 | 8/2006 |
| JP | 2006518495 | 8/2006 |
| KR | 20050084628 | 8/2005 |
| KR | 20050084629 | 8/2005 |
| KR | 20050086424 | 8/2005 |
| KR | 20080086423 | 8/2005 |
| KR | 20050088995 | 9/2005 |
| TW | 470914 | 1/2002 |
| TW | 497074 | 8/2002 |
| TW | 200416594 | 9/2004 |
| WO | 2004042560 | 5/2004 |
| WO | 2004042562 | 5/2004 |
| WO | 2004042569 | 5/2004 |
| WO | 2004042574 | 5/2004 |
| WO | 2006039710 | 4/2006 |
| WO | 2006039711 | 4/2006 |
| WO | 2006039713 | 4/2006 |
| WO | 2004042561 | 5/2006 |

OTHER PUBLICATIONS

Vermeulen F. et al., "Flexible Hardware Acceleration for Multimedia Oriented Microprocessors", Micro-33. Proceedings of the 33rd Annual ACM/IEEE International Symposium on Microarchitecture. Monterey, CA, Dec. 10-13, 2000, Proceedings of the Annual ACM/IEEE International Symposium on Microarchitecture, Los Alamitos, CA: IEEE Comp. Soc, US, Dec. 10, 2000, pp. 171-177.
International Search Report for PCT/US 03/34557, Dec. 21, 2004.
International Search Report for PCT/US03/34558 dated Jun. 16, 2005.
International Search Report for PCT/US03/34559 dated Jan. 7, 2005.
International Search Report for PCT/US2005/035818 dated Aug. 4, 2006.
International Search Report for PCT/US2005/035813.
International Search Report for PCT/US2005/035814 dated Feb. 23, 2006.
Bakshi S; Gajski D D; "Partitioning and Pipelining for Performance-Constrained Hardware/Software Systems", IEEE Transactions on Very Large Scale Integration (VLSI) Systems, vol. 7, NR. 4, pp. 419-432, (1999-12-00), XP000869229.
Free Online Dictionary of Computing (1997) Definitions of "FPGA" and "raw data"; http://foldoc.org.
Hansen (1977) The Architecture of Concurrent Programs; Prentice Hall, Inc.; pp. 16-17, 19-20, 24-27, 47-54, 72-73, 151-152.
Lecurieux-Lafayette (1996) Electronique; CEP Communication; No. 55, pp. 98, 101-103.
Microsoft (1999) Microsoft Computer Dictionary, 4$^{th}$ Edition; Microsoft Press; p. 215.
Microsoft (2002) Microsoft Computer Dictionary, 5$^{th}$ Edition; Microsoft Press; pp. 77-78.
Patterson (1996) Computer Architecture, A Quantitative Approach, 2$^{nd}$ Edition; Morgan Kauffman; pp. 134, 155.
Vermeulen (2000) "Flexible Hardware Acceleration for Multimedia Oriented Microprocessors"; Proceedings of the ACM/IEEE International Symposium on Microarchitecture; Dec. 10, 2000; pp. 171-177.
"Chips: New Accelerator Chip From Hi/fn to Speed-Up Virtual Private Networks—"VPNs" —Product Announcement", EDGE Publishing, On & About AT&T, Oct. 26, 2008, http://findarticles.com/p/articles/mi_m0UNZ/is_1998_Oct_26/ai_53126574, 2 pages.
Lisa Wu, Chris Weaver, and Todd Austin, "CryptoManiac: A Fast Flexible Architecture for Secure Communication", IEEE 2001, 10 pages.
Final Office Action, U.S. Appl. No. 10/684,053, Dated Jul. 19, 2007.
Final Office Action, U.S. Appl. No. 10/684,053, Dated Nov. 5, 2008.
Final Office Action, U.S. Appl. No. 10/684,057, Dated Apr. 19, 2006.
IEEE VHDL Math Package Study Group, "Package_Math Real Version 0.7 9header only)", May 28, 1993, XP002372288, URL: http://tams-www.informatik.uni-hamburg.de/vhdl/packages/P1076.2/mathpack.vhd.
International Search Report, International Patent Application No. PCTUS2003034555, Dated Dec. 23, 2005.
International Search Report, International Patent Application No. PCTUS2003034556, Dated Mar. 7, 2006.
International Search Report, International Patent Application No. PCTUS2003034557, Dated Dec. 21, 2004.
Taiwanese Search Report, Taiwanese Patent Application No. TW092130031, Dated May 13, 2009.
Office Action, U.S. Appl. No. 10/684,053, Dated Oct. 19, 2006.
Office Action, U.S. Appl. No. 10/684,053, Dated Apr. 8, 2008.
Office Action, U.S. Appl. No. 10/684,053, Dated May 5, 2009.
Office Action, U.S. Appl. No. 10/684,057; Dated Nov. 14, 2005.
Office Action, U.S. Appl. No. 10/684,057, Dated Aug. 7, 2007.
Office Action, U.S. Appl. No. 10/683,932, Dated Feb. 13, 2006.
Office Action, U.S. Appl. No, 10/683,932, Dated Oct. 9, 2007.
Rhett Davis: "MatLAB to RTL Synthesis" Jul. 2, 2001, XP002372287 Internet Archive, URL: http://web.archive.org/web/20010702232849/http://bwrc.eecs.berkeley.edu/People/Grad...Students/wrdavis/research/ee244/progress.html.
European Search Report, European Patent Application No. EP0694847, Dated Jun. 14, 1996.
Ramanathan, et al., (1993), "Adaptive Feedback Techniques for Synchronized Multimedia Retrieval Over Integrated Networks", IEEE/ACM Transactions on Networking, vol. 1, No. 2, pp. 246-259.
Tanenbaum, (1984), "Structured Computer Organization, 2nd Edition", pp. 10-12.
Rangan, et al., (1992), "Designing an On-Demand Multimedia Service", IEEE Communications Magazine, pp. 56-64.
Vin, et al, (1992), "System Support for Computer Mediated Multimedia Collaborations", Sharing Perspectives, Toronto, Oct. 31-Nov. 4, 1992, pp. 203-209.

* cited by examiner

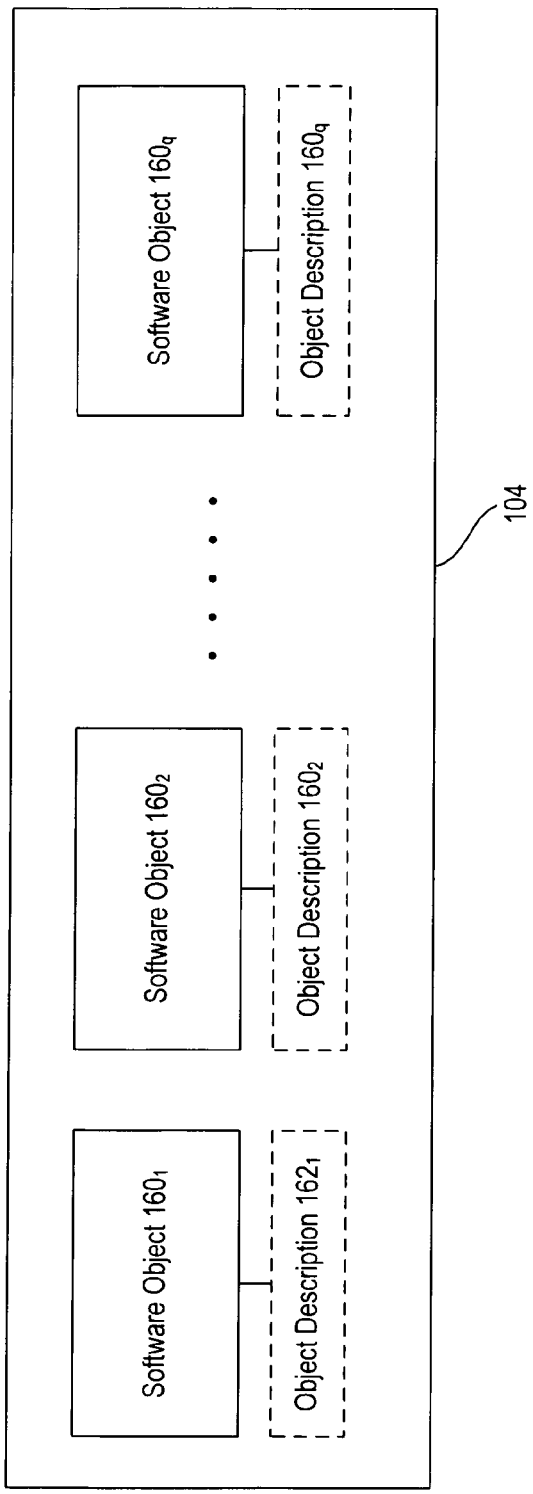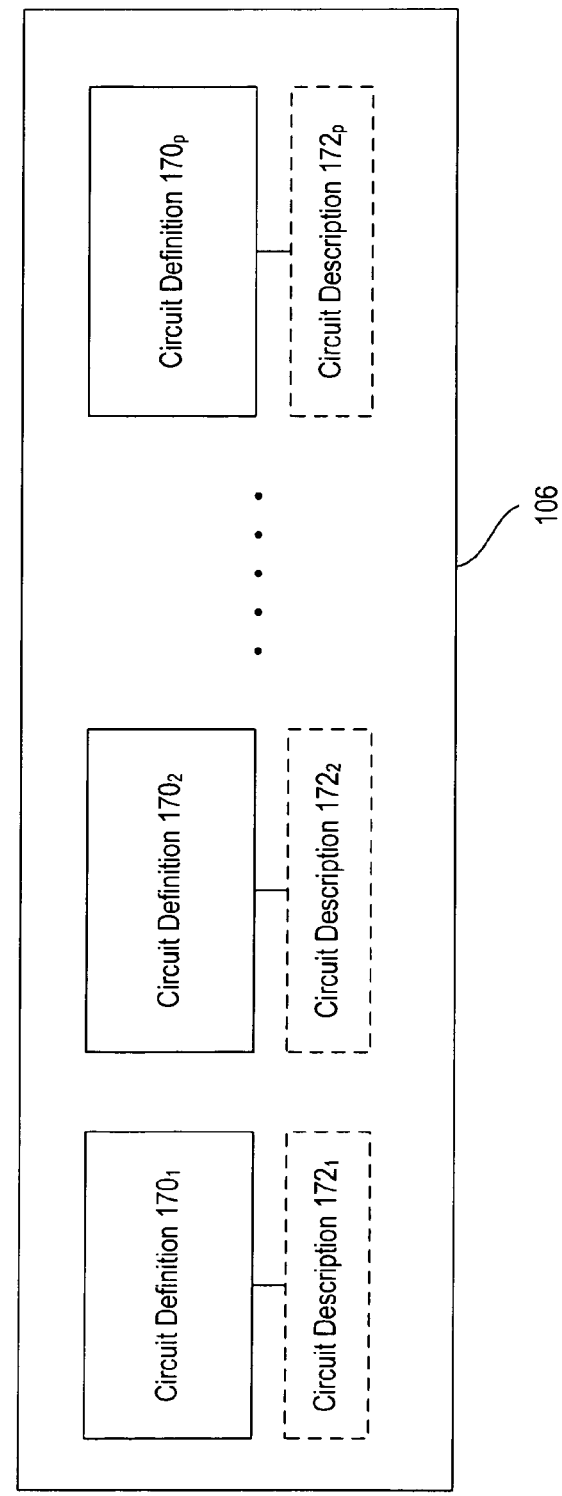

COMPUTING MACHINE WITH REDUNDANCY AND RELATED SYSTEMS AND METHODS

CLAIM OF PRIORITY

This application claims priority to U.S. Provisional Application Ser. Nos. 60/615,192, 60/615,157, 60/615,170, 60/615,158, 60/615,193, and 60/615,050, filed on Oct. 1, 2004, which are incorporated by reference.

CROSS REFERENCE TO RELATED APPLICATIONS

This application is related to U.S. patent application Ser. Nos. 11/243,528, 11/243,509, 11/243,502, 11/243,459, 11/243,508, 11/243,527, and 11/243,506 which have a common filing date and assignee and which are incorporated by reference.

BACKGROUND

A peer-vector computing machine, which is described in the following U.S. Patent Publications, includes a pipeline accelerator that can often perform mathematical computations ten to one hundred times faster than a conventional processor-based computing machine can perform these computations: 2004/0133763; 2004/0181621; 2004/0136241; 2004/0170070; and, 2004/0130927, which are incorporated herein by reference. The pipeline accelerator can often perform mathematical computations faster than a processor because unlike a processor, the accelerator processes data in a pipelined fashion while executing few, if any, software instructions.

Unfortunately, despite its oft-superior data-processing speed, a peer-vector computing machine may lack some of the popular features of a conventional processor-based computing machine.

For example, a peer-vector computing machine may lack the ability to configure itself to operate with the installed hardware that composes the pipeline accelerator; and may lack the ability to reconfigure itself in response to a change in this hardware.

Typically, a conventional processor-based computing machine can configure its software and settings during its start-up routine to operate with the hardware installed in the machine, and can also reconfigure its software and settings in response to a change in this hardware. For example, assume that while the processor-based machine is "off", one increases the amount of the machine's random-access memory (RAM). During the next start-up routine, the machine detects the additional RAM, and reconfigures its operating system to recognize and exploit the additional RAM during subsequent operations. Similarly, assume that one adds a wireless-router card to the bus while the processor-based machine is off. During the next start-up routine, the machine detects the card and configures its operating system to recognize and allow a software application such as a web browser to use the card (the machine may need to download the card's driver via a CD-ROM or the internet). Consequently, to install new hardware in a typical processor-based machine, an operator merely inserts the hardware into the machine, which then configures or reconfigures the machine's software and settings without additional operator input.

But a peer-vector machine may lack the ability to configure or reconfigure itself to operate the hardware that composes the pipeline accelerator. For example, assume that one wants the peer-vector machine to instantiate a pre-designed circuit on multiple programmable-logic integrated circuits (PLICs) such as field-programmable gate arrays (FPGAs), each of which is disposed on a respective pipeline unit of the pipeline accelerator. Typically, one manually generates configuration-firmware files for each of the PLICs, and loads these files into the machine's configuration memory. During a start-up routine, the peer-vector machine causes each of the PLICs to download a respective one of these files. Once the PLICs have downloaded these firmware files, the circuit is instantiated on the PLICs. But if one modifies the circuit, or modifies the type or number of pipeline units in the pipeline accelerator, then he may need to manually generate new configuration-firmware files and load them into the configuration memory before the machine can instantiate the modified circuit on the pipeline accelerator.

Furthermore, the peer-vector computing machine may lack the ability to continue operating if a component of the machine fails.

Some conventional processor-based computing machines have redundant components that allow a machine to be fault tolerant, i.e., to continue operating when a component fails or otherwise exhibits a fault or causes a fault in the machine's operation. For example, a multi-processor-based computing machine may include a redundant processor that can "take over" for one of main processors if and when a main processor fails.

But unfortunately, a peer-vector machine may have a lower level of fault tolerance than a fault-tolerant processor-based machine.

Moreover, existing fault-tolerant techniques may add significant cost and complexity to a computing machine. Per the above example, assume that a processor-based computing machine includes a redundant processor. If the machine has only one main processor, then adding the redundant processor may double the area that the processors occupy, and may double the costs for procuring and maintaining the processors.

Therefore, a need has arisen for a peer-vector computing machine that can configure itself to operate with the hardware that composes the pipeline accelerator, and that can reconfigure itself to recognize and operate with newly modified accelerator installed hardware.

A need has also arisen for a peer-vector machine having a higher level of fault tolerance.

Furthermore, a need has arisen for a fault-tolerant technique that is less costly and complex than providing redundancy solely by the inclusion of dedicated redundant components.

SUMMARY

According to an embodiment of the invention, a computing machine comprises a pipeline accelerator, a host processor coupled to the pipeline accelerator, and a redundant processor, a redundant pipeline unit, or both, coupled to the host processor and to the pipeline accelerator. The computing machine may also include a system-restore server and a system-restore bus that allow the machine to periodically save the machine states in case of a failure.

Such a computing machine has a fault-tolerant scheme that is often more flexible than conventional schemes. For example, if the pipeline accelerator has more extra "space" than the host processor, then one can add to the computing machine one or more redundant pipeline units that can provide redundancy to both the pipeline and the host processor.

Therefore, the computing machine can include redundancy for the host processor even though it has no redundant processing units. Likewise, if the host processor has more extra "space" than the pipeline accelerator, then one can add to the computing machine one or more redundant processing units that can provide redundancy to both the pipeline and the host processor.

BRIEF DESCRIPTION OF THE DRAWINGS

FIG. 7 is a block diagram of the software-object library of FIG. 4 according to an embodiment of the invention.

FIG. 8 is a block diagram of the circuit-definition library of FIG. 4 according to an embodiment of the invention.

DETAILED DESCRIPTION

Introduction

An accelerator-configuration manager that, according to embodiments of the invention, configures a peer-vector machine to operate with the hardware that composes the machine's pipeline accelerator and that reconfigures the machine to recognize and operate with newly modified accelerator hardware are discussed below in conjunctions with FIGS. 10-14. And an accelerator-configuration registry that, according to embodiments of the invention, facilitate the configuration manager's ability to configure and reconfigure the peer-vector machine is discussed below in conjunction with FIGS. 4-9.

Furthermore, improved fault-tolerant techniques that, according to embodiments of the invention, allow a peer-vector machine to continue operating if a portion of the machine fails are discussed below in conjunction with FIGS. 10-16.

Figure 1:
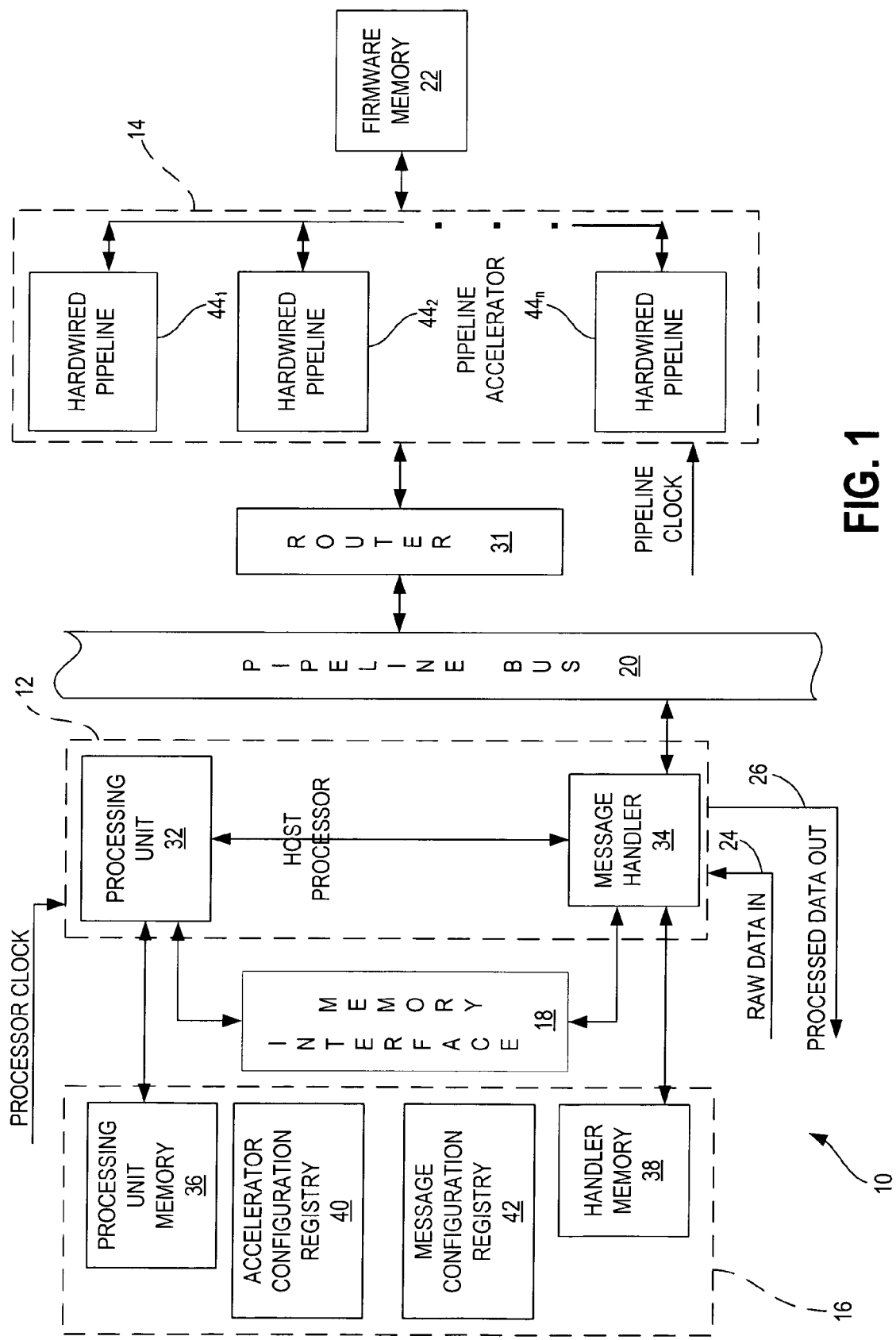
FIG. 1 is a schematic block diagram of a peer-vector computing machine according to an embodiment of the invention.
Figure 2:
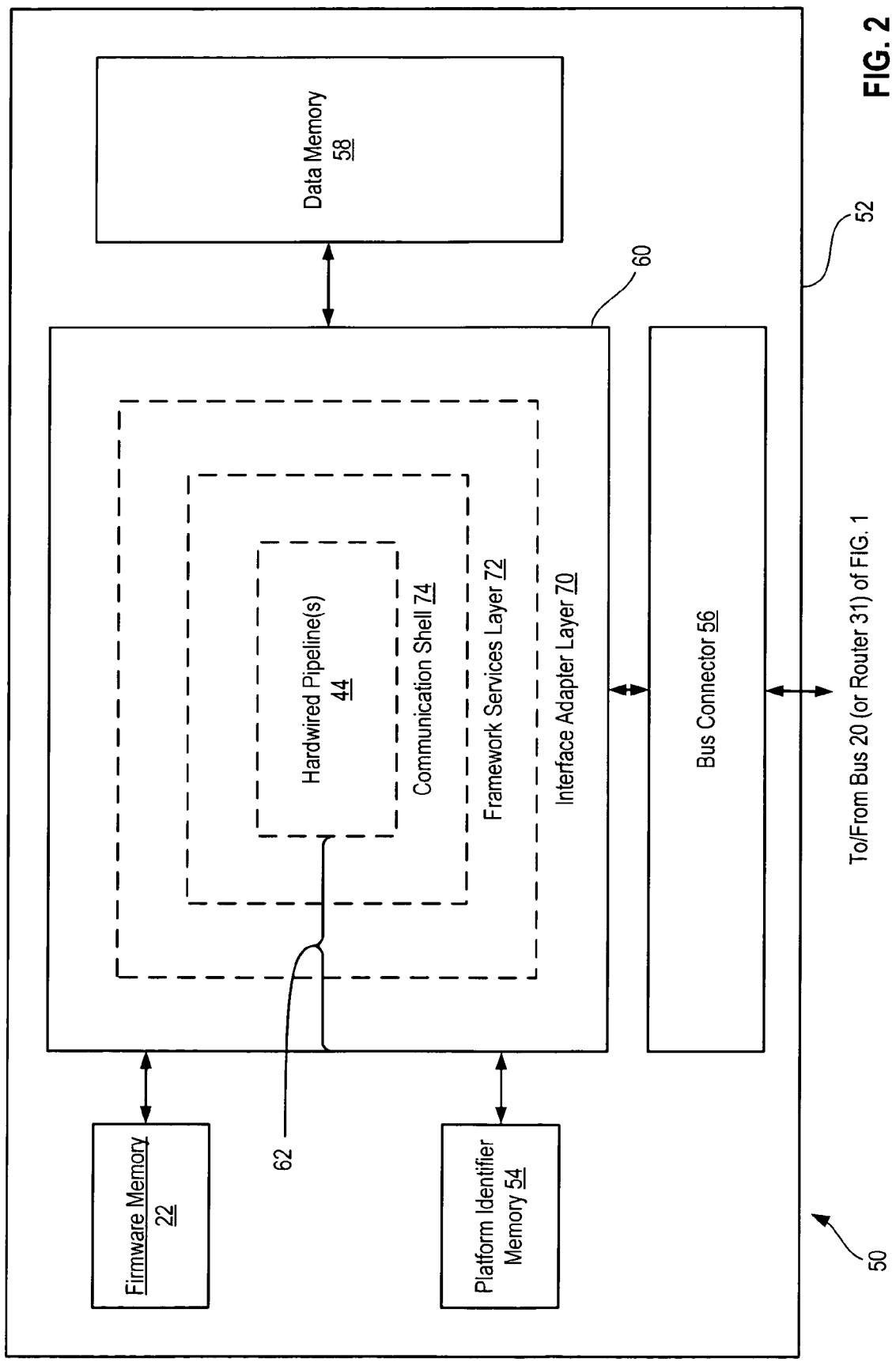
FIG. 2 is a schematic block diagram of a pipeline unit from the pipelined accelerator of FIG. 1 and including a PLIC according to an embodiment of the invention.
Figure 3:
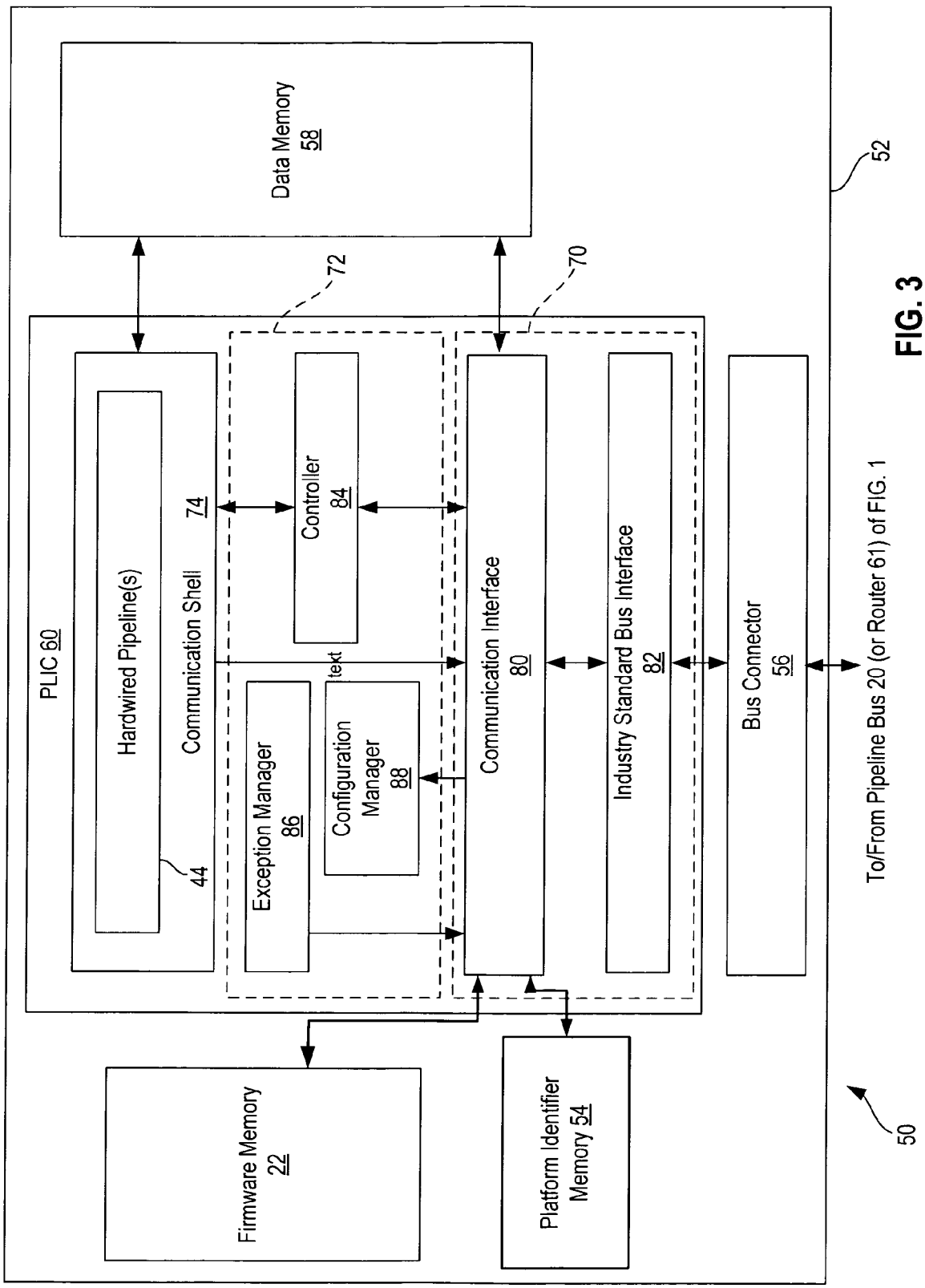
FIG. 3 is a block diagram of the circuitry that composes the interface-adapter and framework-services layers of the PLIC of FIG. 2 according to an embodiment of the invention.

But first is presented in conjunction with FIGS. 1-3 an overview of peer-vector-machine concepts that should facilitate the reader's understanding of the above-mentioned configuration manager, configuration registry, and fault-tolerant techniques.

Overview of Peer-Vector-Machine Concepts

FIG. 1 is a schematic block diagram of a computing machine 10, which has a peer-vector architecture according to an embodiment of the invention. In addition to a host processor 12, the peer-vector machine 10 includes a pipelined accelerator 14, which is operable to process at least a portion of the data processed by the machine 10. Therefore, the host-processor 12 and the accelerator 14 are "peers" that can transfer data messages back and forth. Because the accelerator 14 includes hardwired circuits (typically logic circuits) instantiated on one or more PLICs, it executes few, if any, program instructions, and thus for a given clock frequency, often performs mathematically intensive operations on data significantly faster than a bank of computer processors can. Consequently, by combining the decision-making ability of the processor 12 and the number-crunching ability of the accelerator 14, the machine 10 has many of the same abilities as, but can often process data faster than, a conventional processor-based computing machine. Furthermore, as discussed below and in previously incorporated U.S. Patent Application Publication No. 2004/0136241, providing the accelerator 14 with a communication interface that is compatible with the interface of the host processor 12 facilitates the design and modification of the machine 10, particularly where the communication interface is an industry standard. And where the accelerator 14 includes multiple pipeline units (not shown in FIG. 1) which are sometimes called daughter cards, providing each of these units with this compatible communication interface facilitates the design and modification of the accelerator, particularly where the communication interface is an industry standard. Moreover, the machine 10 may also provide other advantages as described in the following previously incorporated U.S. Patent Publication Nos.: 2004/0133763; 2004/0181621; 2004/0136241; 2004/0170070; and, 2004/0130927.

Still referring to FIG. 1, in addition to the host processor 12 and the pipelined accelerator 14, the peer-vector computing machine 10 includes a processor memory 16, an interface memory 18, a pipeline bus 20, a firmware memory 22, an optional raw-data input port 24, an optional processed-data output port 26, and an optional router 31.

The host processor 12 includes a processing unit 32 and a message handler 34, and the processor memory 16 includes a processing-unit memory 36 and a handler memory 38, which respectively serve as both program and working memories for the processor unit and the message handler. The processor memory 36 also includes an accelerator/host-processor-configuration registry 40 and a message-configuration registry 42. The registry 40 stores configuration data that allows a configuration manager (not shown in FIG. 1) executed by the host processor 12 to configure the functioning of the accelerator 14 and, in some situations as discussed below in conjunction with FIGS. 10-14, the functioning of the host processor. Similarly, the registry 42 stores configuration data that allows the host processor 12 to configure the structure of the messages that the message handler 34 sends and receives, and the paths over which the message handler sends and receives these messages.

The pipelined accelerator 14 includes at least one pipeline unit (not shown in FIG. 1) on which is disposed at least one PLIC (not shown in FIG. 1). On the at least one PLIC is disposed at least one hardwired pipeline, which processes data while executing few, if any, program instructions. The firmware memory 22 stores the configuration-firmware files for the PLIC(s) of the accelerator 14. If the accelerator 14 is disposed on multiple PLICs, then these PLICs and their respective firmware memories may be disposed on multiple pipeline units. The accelerator 14 and pipeline units are discussed further in previously incorporated U.S. Patent Application Publication Nos. 2004/0136241, 2004/0181621, and 2004/0130927. The pipeline units are also discussed below in conjunction with FIGS. 2-3.

Generally, in one mode of operation of the peer-vector computing machine 10, the pipelined accelerator 14 receives data from one or more data-processor software applications running on the host processor 12, processes this data in a pipelined fashion with one or more logic circuits that perform one or more mathematical operations, and then returns the resulting data to the data-processing application(s). As stated above, because the logic circuits execute few, if any, software instructions, they often process data one or more orders of magnitude faster than the host processor 12 can for a given clock frequency. Furthermore, because the logic circuits are instantiated on one or more PLICs, one can often modify these circuits merely by modifying the firmware stored in the memory 52; that is, one can often modify these circuits without modifying the hardware components of the accelerator 14 or the interconnections between these components.

The operation of the peer-vector machine 10 is further discussed in previously incorporated U.S. Patent Application Publication No. 2004/0133763, the functional topology and operation of the host processor 12 is further discussed in previously incorporated U.S. Patent Application Publication No. 2004/0181621, and the topology and operation of the accelerator 14 is further discussed in previously incorporated U.S. Patent Application Publication No. 2004/0136241.

FIG. 2 is a schematic block diagram of a pipeline unit 50 of the pipeline accelerator 14 of FIG. 1 according to an embodiment of the invention.

The unit 50 includes a circuit board 52 on which are disposed the firmware memory 22, a platform-identification memory 54, a bus connector 56, a data memory 58, and a PLIC 60.

As discussed above in conjunction with FIG. 1, the firmware memory 22 stores the configuration-firmware file that the PLIC 60 downloads to instantiate one or more logic circuits, at least some of which compose the hardwired pipelines (44).

The platform memory 54 stores one or more values, i.e., platform identifiers, that respectively identify the one or more platforms with which the pipeline unit 50 is compatible. Generally, a platform specifies a unique set of physical attributes that a pipeline unit may possess. Examples of these attributes include the number of external pins (not shown) on the PLIC 60, the width of the bus connector 56, the size of the PLIC, and the size of the data memory 58. Consequently, a pipeline unit 50 is compatible with a platform if the unit possesses all of the attributes that the platform specifies. So a pipeline unit 50 having a bus connector 56 with thirty two bits is incompatible with a platform that specifies a bus connector with sixty four bits. Some platforms may be compatible with the peer vector machine 10 (FIG. 1), and others may be incompatible. Consequently, the platform identifier(s) stored in the memory 54 may allow a configuration manager (not shown in FIG. 2) executed by the host processor 12 (FIG. 1) to determine whether the pipeline unit 50 is compatible with the platform(s) supported by the machine 10. And where the pipeline unit 50 is so compatible, the platform identifier(s) may also allow the configuration manager to determine how to configure the PLIC 60 or other portions of the pipeline unit as discussed below in conjunction with FIGS. 10-14.

The bus connector 56 is a physical connector that interfaces the PLIC 60, and perhaps other components of the pipeline unit 50, to the pipeline bus 20 (FIG. 1).

The data memory 58 acts as a buffer for storing data that the pipeline unit 50 receives from the host processor 12 (FIG. 1) and for providing this data to the PLIC 60. The data memory 58 may also act as a buffer for storing data that the PLIC 60 generates for sending to the host processor 12, or as a working memory for the hardwired pipeline(s) 44.

Instantiated on the PLIC 60 are logic circuits that compose the hardwired pipeline(s) 44, and a hardware interface layer 62, which interfaces the hardwired pipeline(s) to the external pins (not shown) of the PLIC 60, and which thus interfaces the pipeline(s) to the pipeline bus 20 (via the connector 56), to the firmware and platform-identification memories 22 and 54, and to the data memory 58. Because the topology of the interface layer 62 is primarily dependent upon the attributes specified by the platform(s) with which the pipeline unit 50 is compatible, one can often modify the pipeline(s) 44 without modifying the interface layer. For example, if a platform with which the unit 50 is compatible specifies a thirty-two bit bus, then the interface layer 62 provides a thirty-two-bit bus connection to the bus connector 56 regardless of the topology or other attributes of the pipeline(s) 44.

The hardware-interface layer 62 includes three circuit layers that are instantiated on the PLIC 60: an interface-adapter layer 70, a framework-services layer 72, and a communication layer 74, which is hereinafter called a communication shell. The interface-adapter layer 70 includes circuitry, e.g., buffers and latches, that interface the framework-services layer 72 to the external pins (not shown) of the PLIC 60. The framework-services layer 72 provides a set of services to the hardwired pipeline(s) 44 via the communication shell 74. For example, the layer 72 may synchronize data transfer between the pipeline(s) 44, the pipeline bus 20 (FIG. 1), and the data memory 58 (FIG. 2), and may control the sequence(s) in which the pipeline(s) operate. The communication shell 74 includes circuitry, e.g., latches, that interface the framework-services layer 72 to the pipeline(s) 44.

Still referring to FIG. 2, alternate embodiments of the pipeline unit 50 are contemplated. For example, the memory 54 may be omitted, and the platform identifier(s) may stored in the firmware memory 22, or by a jumper-configurable or hardwired circuit (not shown) disposed on the circuit board 52. Furthermore, although the framework-services layer 72 is shown as isolating the interface-adapter layer 70 from the communication shell 74, the interface-adapter layer may, at least at some circuit nodes, be directly coupled to the communication shell. Furthermore, although the communication shell 74 is shown as isolating the interface-adapter layer 70 and the framework-services layer 72 from the pipeline(s) 44, the interface-adapter layer or the framework-services layer may, at least at some circuit nodes, be directly coupled to the pipeline(s).

A pipeline unit similar to the unit 50 is discussed in previously incorporated U.S. Patent Application Publication No. 2004/0136241.

FIG. 3 is a schematic block diagram of the circuitry that composes the interface-adapter layer 70 and the framework-services layer 72 of FIG. 2 according to an embodiment of the invention.

A communication interface 80 and an optional industry-standard bus interface 82 compose the interface-adapter layer 70, and a controller 84, exception manager 86, and configuration manager 88 compose the framework-services layer 72. The configuration manager 88 is local to the PLIC 60, and is thus different from the configuration manager executed by the host processor 12 as discussed above in conjunction with FIG. 1 and below in conjunction with FIGS. 10-14.

The communication interface 80 transfers data between a peer, such as the host processor 12 (FIG. 1) or another pipeline unit 50 (FIG. 2), and the firmware memory 22, the platform-identifier memory 54, the data memory 58, and the following circuits instantiated within the PLIC 60: the hardwired pipeline(s) 44 (via the communication shell 74), the controller 84, the exception manager 86, and the configuration manager 88. If present, the optional industry-standard bus interface 82 couples the communication interface 80 to the bus connector 56. Alternatively, the interfaces 80 and 82 may be merged such that the functionality of the interface 82 is included within the communication interface 80.

The controller 84 synchronizes the hardwired pipeline(s) 44 and monitors and controls the sequence in which it/they perform the respective data operations in response to communications, i.e., "events," from other peers. For example, a peer such as the host processor 12 may send an event to the pipeline unit 50 via the pipeline bus 20 to indicate that the peer has finished sending a block of data to the pipeline unit and to cause the hardwired pipeline(s) $44_1$ to begin processing this data. An event that includes data is typically called a message, and an event that does not include data is typically called a "door bell."

The exception manager 86 monitors the status of the hardwired pipeline(s) $44_1$, the communication interface 80, the communication shell 74, the controller 84, and the bus interface 82 (if present), and reports exceptions to another exception manager (not shown in FIG. 3) the host processor 12 (FIG. 1). For example, if a buffer (not shown) in the communication interface 80 overflows, then the exception manager 86 reports this to the host processor 12. The exception manager may also correct, or attempt to correct, the problem giving rise to the exception. For example, for an overflowing buffer, the exception manager 86 may increase the size of the buffer, either directly or via the configuration manager 88 as discussed below.

The configuration manager 88 sets the "soft" configuration of the hardwired pipeline(s) 44, the communication interface 80, the communication shell 74, the controller 84, the exception manager 86, and the interface 82 (if present) in response to soft-configuration data from the host processor 12 (FIG. 1). As discussed in previously incorporated U.S. Patent Application Publication No. 2004/0133763, the "hard" configuration of a circuit within the PLIC 60 denotes the actual instantiation, on the transistor and circuit-block level, of the circuit, and the soft configuration denotes the settable physical parameters (e.g., data type, table size buffer depth) of the instantiated component. That is, soft-configuration data is similar to the data that one can load into a register of a processor (not shown in FIG. 3) to set the operating mode (e.g., burst-memory mode, page mode) of the processor. For example, the host processor 12 may send to the PLIC 60 soft-configuration data that causes the configuration manager 88 to set the number and respective priority levels of queues (not shown) within the communication interface 80. And as discussed in the preceding paragraph, the exception manager 86 may also send soft-configuration data that causes the configuration manager 88 to, e.g., increase the size of an overflowing buffer in the communication interface 80.

The communication interface 80, optional industry-standard bus interface 82, controller 84, exception manager 86, and configuration manager 88 are further discussed in previously incorporated U.S. Patent Application Publication No. 2004/0136241.

Referring again to FIGS. 2-3, although the pipeline unit 50 is disclosed as including only one PLIC 60, the pipeline unit may include multiple PLICs. For example, as discussed in previously incorporated U.S. Patent Application Publication No. 2004/0136241, the pipeline unit 50 may include two interconnected PLICs, where the circuitry that composes the interface-adapter layer 70 and framework-services layer 72 are instantiated on one of the PLICs, and the circuitry that composes the communication shell 74 and the hardwired pipeline(s) 44 are instantiated on the other PLIC.

Figure 4:
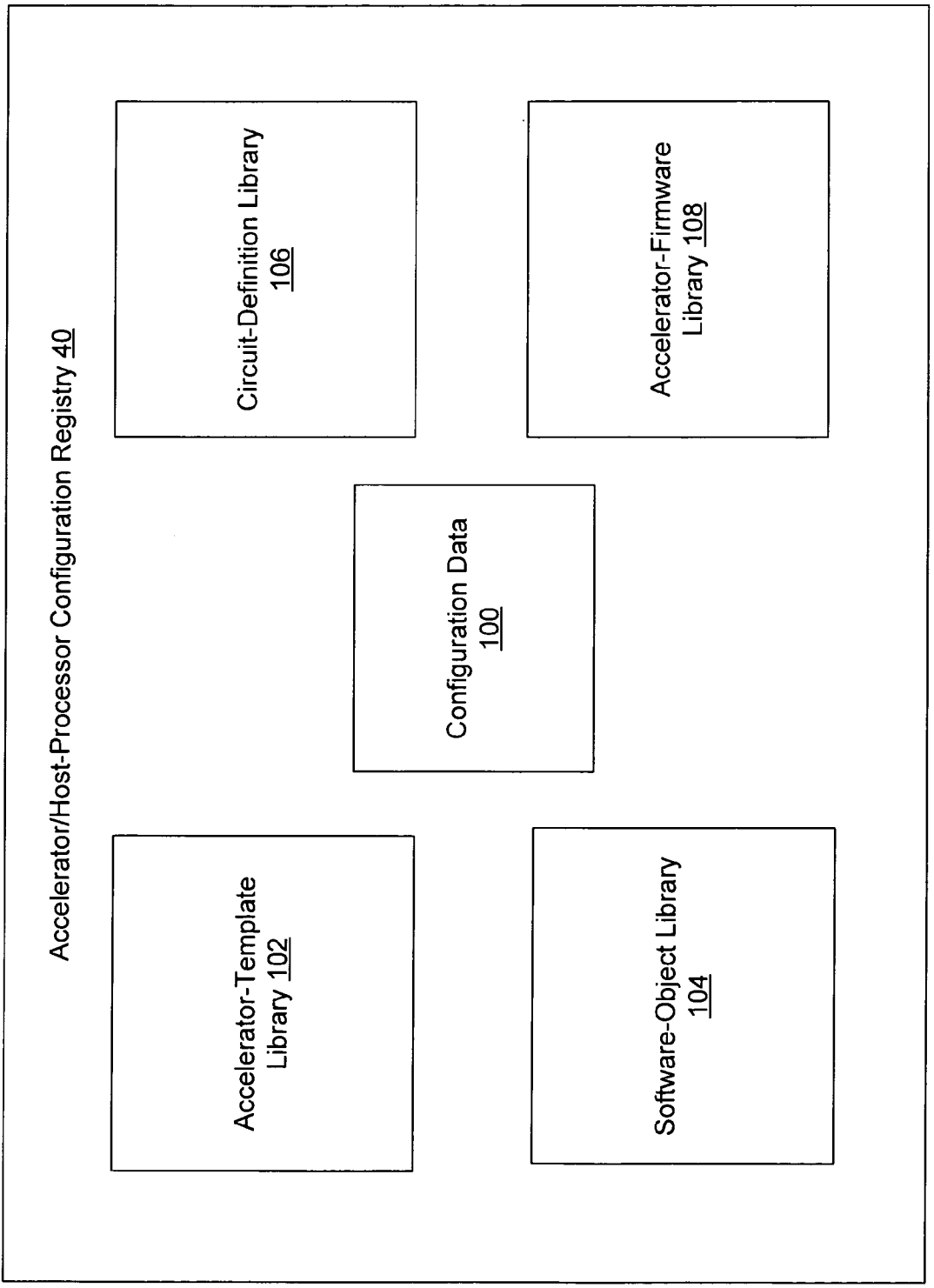
FIG. 4 is a block diagram of the accelerator/host-processor-configuration registry of FIG. 1 according to an embodiment of the invention.

FIG. 4 is a block diagram of the accelerator/host-processor configuration registry 40 of FIG. 1 according to an embodiment of the invention.

The registry 40 includes configuration data 100, an accelerator-template library 102, a software-object library 104, a circuit-definition library 106, and an accelerator-firmware library 108.

The configuration data 100 contains instructions that the configuration manager (not shown in FIG. 4) executed by the host processor 12 (FIG. 1) follows to configure the accelerator 14 (FIG. 1), and is further discussed below in conjunction with FIGS. 10-14. These instructions may be written in any conventional language or format.

The accelerator-template library 102 contains templates that define one or more interface-adapter layers 70, framework-services layers 72, communication shells 74, and hardwired pipelines 44 that the configuration manager executed by the host processor 12 (FIG. 1) can instantiate on the PLICs 60 (FIG. 2). The library 102 is further discussed below in conjunction with FIGS. 5-6B.

The software-object library 104 contains one or more software objects that, when executed, respectively perform in software the same (or similar) functions that the pipelines 44 defined by the templates in the accelerator-template library 102 perform in hardware. These software objects give the configuration manager executed by the host processor 12 the flexibility of instantiating in software at least some of the pipelined functions specified by the configuration data 100. The library 104 is further discussed below in conjunction with FIG. 7.

The circuit-definition library 106 contains one or more circuit-definition files that each define a respective circuit for instantiation on the accelerator 14 (FIG. 1). Each circuit typically includes one or more interconnected hardwired pipelines 44 (FIG. 1), which are typically defined by corresponding templates in the library 102. The library 106 is further discussed below in conjunction with FIG. 8.

The accelerator-firmware library 108 contains one or more firmware-configuration files that each PLIC 60 (FIG. 2) of the accelerator 14 (FIG. 1) respectively downloads to set its internal circuit-node connections so as to instantiate a respective interface-adapter layer 70, framework-services layer 72, communication shell 74, and hardwired pipeline(s) 44. The library 108 is further discussed below in conjunction with FIG. 9.

Figure 5:
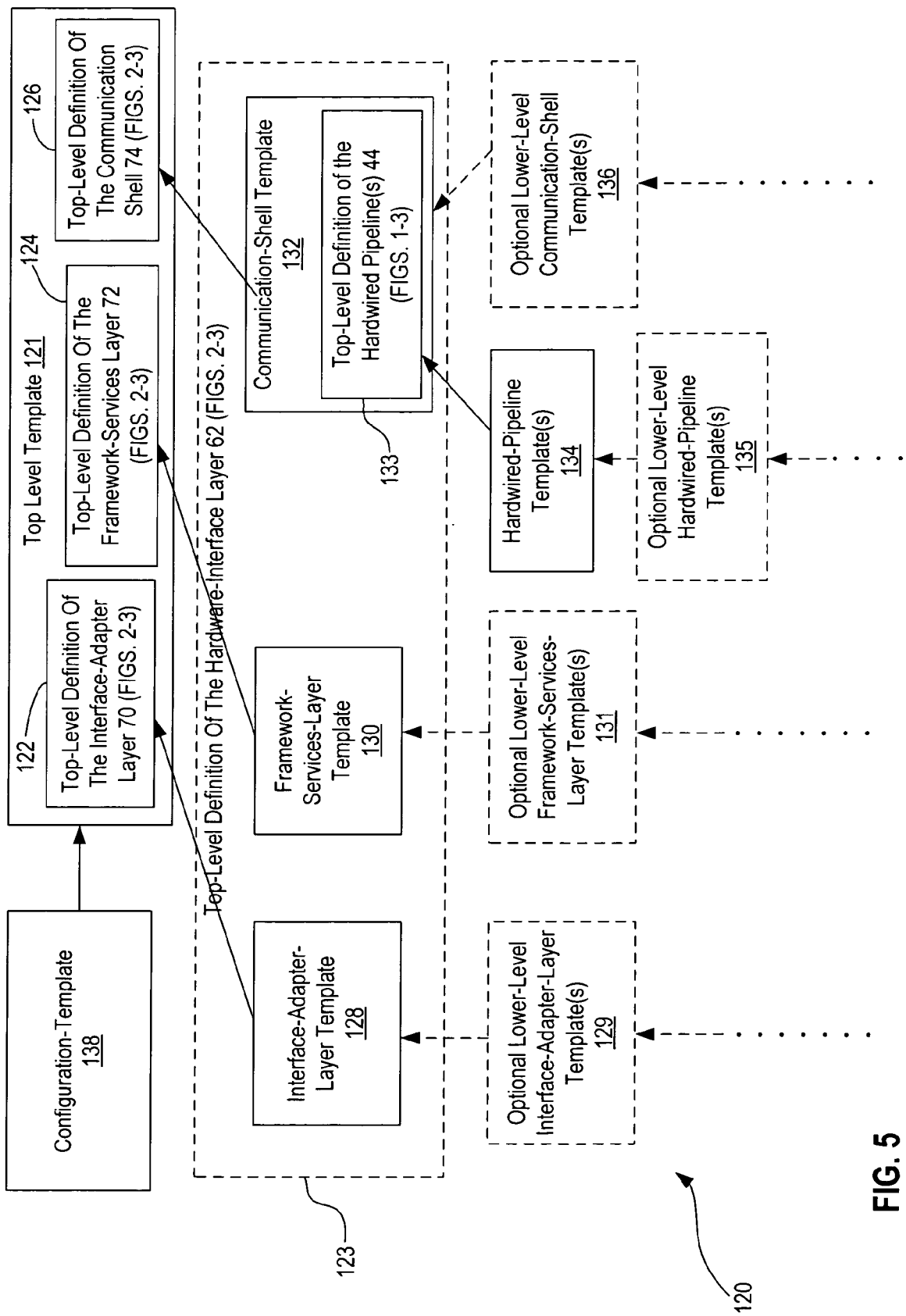
FIG. 5 is a diagram of a hardware-description file that describes, in a top-down fashion the layers of circuitry to be instantiated on a simple PLIC according to an embodiment of the invention.

FIG. 5 is a block diagram of a hardware-description file 120 from which the configuration manager (not shown in FIG. 5) executed by the host processor 12 (FIG. 1) can generate firmware for setting the circuit-node connections within a PLIC such as the PLIC 60 (FIGS. 2-3) according to an embodiment of the invention. The accelerator-template library 102 contains templates that one can arrange to compose the file 120; consequently, an understanding of the hardware-description file 120 should facilitate the reader's understanding of the accelerator-template library 102, which is discussed below in conjunction with FIGS. 6A and 6B.

Typically, the below-described templates of the hardware-description file 120 are written in a conventional hardware description language (HDL) such as Verilog® HDL, and are organized in a top-down structure that resembles the top-down structure of software source code that incorporates software objects. A similar hardware-description file is described in previously incorporated U.S. patent application Ser. No. 11/243,509. Furthermore, techniques for generating PLIC firmware from the file 120 are discussed below in conjunction with FIGS. 10-14.

The hardware-description file 120 includes a top-level template 121, which contains respective top-level definitions 122, 124, and 126 of the interface-adapter layer 70, the framework-services layer 72, and the communication shell 74—together, the definitions 122, 124, and 126 compose a top-level definition 123 of the hardware-interface layer 62—of a PLIC such as the PLIC 60 (FIGS. 2-3). The template 121 also defines the connections between the external pins (not shown) of the PLIC and the interface-adapter layer 70 (and in some cases between the external pins and the framework-services layer 72), and also defines the connections between the framework-services layer and the communication shell 74 (and in some cases between the interface-adapter layer and the communication shell).

The top-level definition 122 of the interface-adapter layer 70 (FIGS. 2-3) incorporates an interface-adapter-layer template 128, which further defines the portions of the interface adapter layer defined by the top-level definition 122. For example, suppose that the top-level definition 122 defines a data-input buffer (not shown) in terms of its input and output nodes. That is, suppose the top-level definition 122 defines the data-input buffer as a functional block having defined input and output nodes. The template 128 defines the circuitry that composes this functional buffer block, and defines the connections between this circuitry and the buffer input nodes and output nodes already defined by in the top-level definition 122. Furthermore, the template 128 may incorporate one or more lower-level templates 129 that further define the data buffer or other components of the interface-adapter layer 70 already defined in the template 128. Moreover, these one or more lower-level templates 129 may each incorporate one or more even lower-level templates (not shown), and so on, until all portions of the interface-adapter layer 70 are defined in terms of circuit components (e.g., flip-flops, logic gates) that a PLIC synthesizing and routing tool (not shown) recognizes—a PLIC synthesizing and routing tool is a conventional tool, typically provided by the PLIC manufacturer, that can generate from the hardware-description file 120 configuration firmware for a PLIC.

Similarly, the top-level definition 124 of the framework-services layer 72 (FIGS. 2-3) incorporates a framework-services-layer template 130, which further defines the portions of the framework-services layer defined by the top-level definition 124. For example, suppose that the top-level definition 124 defines a counter (not shown) in terms of its input and output nodes. The template 130 defines the circuitry that composes this counter, and defines the connections between this circuitry and the counter input and output nodes already defined in the top-level definition 124. Furthermore, the template 130 may incorporate a hierarchy of one or more lower-level templates 131 and even lower-level templates (not shown), and so on such that all portions of the framework-services layer 72 are, at some level of the hierarchy, defined in terms of circuit components (e.g., flip-flops, logic gates) that the PLIC synthesizing and routing tool recognizes. For example, suppose that the template 130 defines the counter as including a count-up/down selector having input and output nodes. The template 130 may incorporate a lower-level template 131 that defines the circuitry within this up/down selector and the connections between this circuitry and the selector's input and output nodes already defined by the template 130.

Likewise, the top-level definition 126 of the communication shell 74 (FIGS. 2-3) incorporates a communication-shell template 132, which further defines the portions of the communication shell defined by the definition 126, and which also includes a top-level definition 133 of the hardwired pipeline(s) 44 disposed within the communication shell. For example, the definition 133 defines the connections between the communication shell 74 and the hardwired pipeline(s) 44.

The top-level definition 133 of the pipeline(s) 44 (FIGS. 2-3) incorporates for each defined pipeline a respective hardwired-pipeline template 134, which further defines the portions of the respective pipeline 44 already defined by the definition 133. The template or templates 134 may each incorporate a hierarchy of one or more lower-level templates 135, and even lower-level templates, such that all portions of the respective pipeline 44 are, at some level of the hierarchy, defined in terms of circuit components (e.g., flip-flops, logic gates) that the PLIC synthesizing and routing tool recognizes.

Moreover, the communication-shell template 132 may incorporate a hierarchy of one or more lower-level templates 136, and even lower-level templates, such that all portions of the communication shell 74 other than the pipeline(s) 44 are, at some level of the hierarchy, also defined in terms of circuit components (e.g., flip-flops, logic gates) that the PLIC synthesizing and routing tool recognizes.

Still referring to FIG. 5, a configuration template 138 provides definitions for one or more parameters having values that one can set to configure the circuitry that the templates 121, 128, 129, 130, 131, 132, 134, 135, and 136, and the even lower-level templates (not shown) define. For example, suppose that the bus interface 82 (FIG. 3) of the interface-adapter layer 70 (FIG. 3) is configurable to have either a thirty-two-bit or a sixty-four-bit interface to the bus connector 56. The configuration template 138 defines a parameter BUS-WIDTH, the value of which determines the width of the interface 82. For example, BUS-WIDTH=0 configures the interface 82 to have a thirty-two-bit interface, and BUS-WIDTH=1 configures the interface 82 to have a sixty-four-bit interface. Examples of other parameters that may be configurable in this manner include the depth of a first-in-first-out (FIFO) data buffer (not shown) disposed within the data memory 58 (FIGS. 2-3), the lengths of messages received and transmitted by the interface adapter layer 70, the precision and data type (e.g., integer, floating-point) of the pipeline(s) 44, and a constant coefficient of a mathematical expression (e.g., "a"° in $ax^2$) that a pipeline executes.

One or more of the templates 121, 128, 129, 130, 131, 132, 134, 135, and 136 and the lower-level templates (not shown) incorporate the parameter(s) defined in the configuration template 138. The PLIC synthesizer and router tool (not shown) configures the interface-adapter layer 70, the framework-services layer 72, the communication shell 74, and the hardwired pipeline(s) 44 (FIGS. 2-3) according to the set values in the template 138 during the synthesis of the hardware-description file 120. Consequently, to reconfigure the circuit parameters associated with the parameters defined in the configuration template 138, one need only modify the values of these parameters in the configuration template, and then rerun the synthesizer and router tool on the file 120. Alternatively, if one or more of the parameters in the configuration template 138 can be sent to the PLIC as soft-configuration data after instantiation of the circuit, then one can modify the corresponding circuit parameters by merely modifying the soft-configuration data. Therefore, according to this alternative, may avoid rerunning the synthesizer and router tool on the file 120. Moreover, templates (e.g., 121, 128, 129, 130, 131, 132, 134, 135, and 136) that do not incorporate settable parameters such as those provided by the configuration template 138 are sometimes called modules or entities, and are typically lower-level templates that include Boolean expressions that a synthesizer and router tool (not shown) converts into circuitry for implementing the expressions.

Alternate embodiments of the hardware-description file 120 are contemplated. For example, although described as defining circuitry for instantiation on a PLIC, the file 120 may define circuitry for instantiation on an application-specific integrated circuit (ASIC).

Figure 6A:
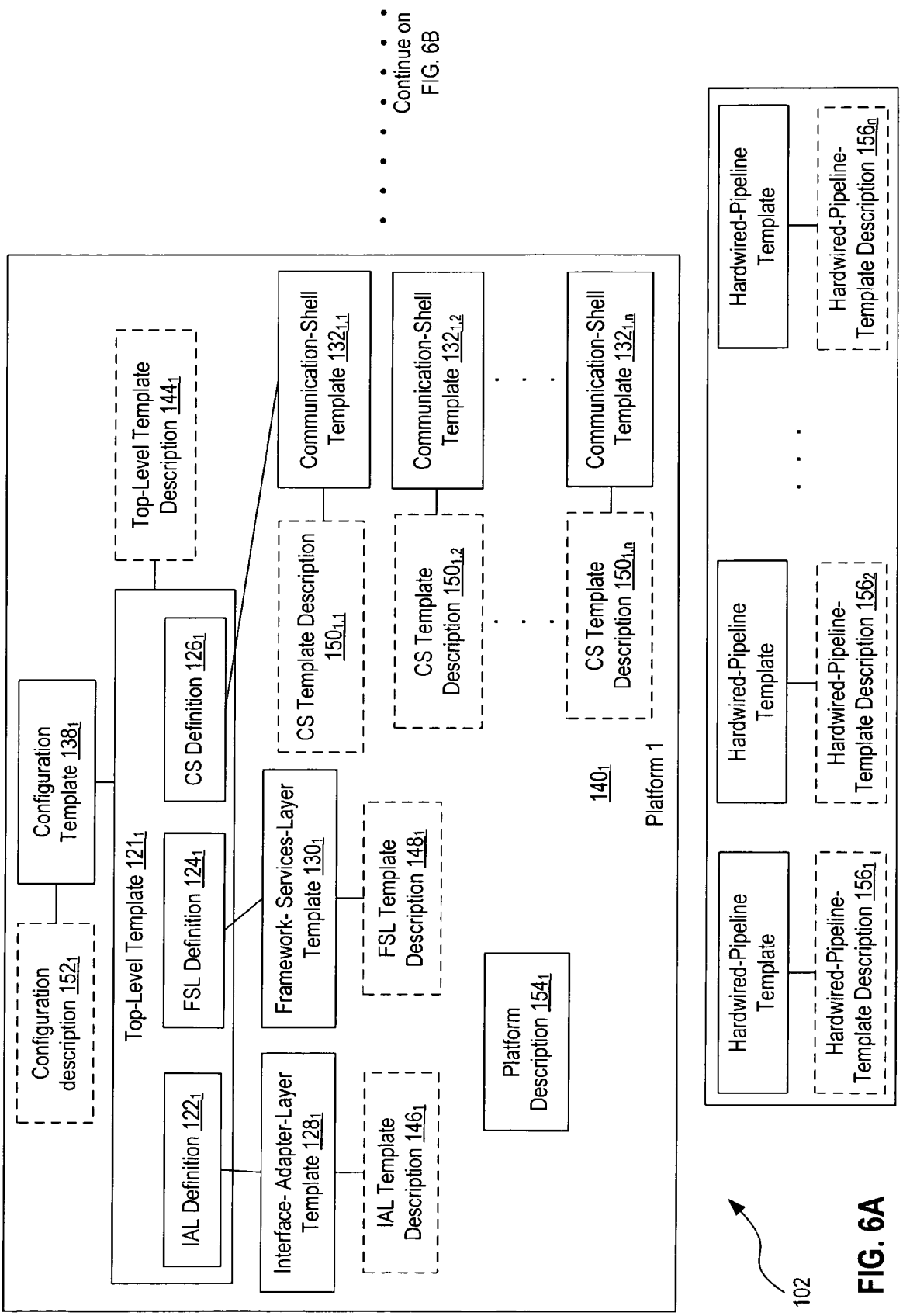
FIGS. 6A and 6B are block diagrams of the accelerator-template library of FIG. 4 according to an embodiment of the invention.
Figure 6B:
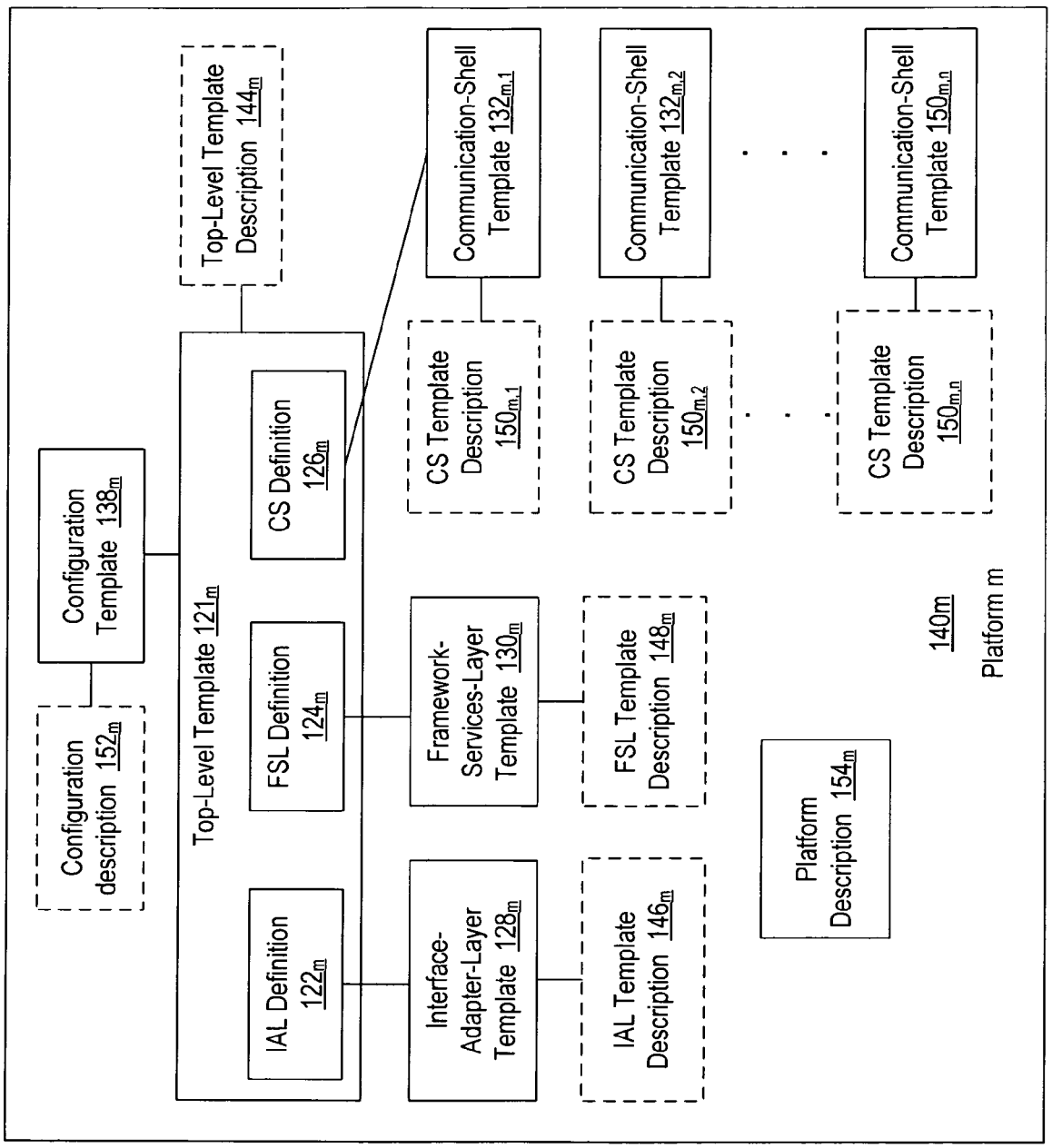

FIGS. 6A and 6B are block diagrams of the accelerator-template library 102 of FIG. 4 according to an embodiment of the invention. The library 102 contains one or more versions of the templates described above in conjunction with FIG. 5. For clarity, however, the optional lower-level templates 129, 131, 135, and 136 are omitted from FIGS. 6A and 6B. Furthermore, a library similar to the library 102 is described in previously incorporated U.S. patent application Ser. No. 11/243,509.

The library 102 has m+1 sections: m sections $140_1$-$140_m$ for the respective m platforms that the library supports, and a section 142 for the hardwired pipelines 44 (FIGS. 1-3) that the library supports.

For example purposes, the library section $140_1$ is discussed in detail, it being understood that the other library sections $140_2$-$140_m$ are similar.

The library section $140_1$ includes a top-level template $121_1$, which is similar to the template 121 of FIG. 5, and which thus includes top-level definitions $122_1$, $124_1$, and $126_1$ of the respective versions of the interface-adapter layer (IAL) 70, the framework-services layer (FSL) 72, and the communication shell(s) 74 (FIGS. 2-3) that are compatible with the platform m=1, i.e., platform 1.

In this embodiment, we assume that there is only one version of the interface-adapter layer 70 and one version of the framework services layer 72 (FIGS. 2-3) available for each platform m, and, therefore, that the library section $140_1$ includes only one interface-adapter-layer template $128_1$ and only one framework-services-layer template $130_1$. But in an embodiment where each platform m includes multiple versions of the interface-adapter layer 70 and multiple versions of the framework-services layer 72, the library section 140, would include multiple interface-adapter- and framework-services-layer templates 128 and 130.

The library section 140, also includes n communication-shell templates $132_{1,1}$-$132_{1,n}$, which respectively correspond to the hardwired-pipeline templates $134_1$-$134_n$ in the library section 142. As stated above in conjunction with FIGS. 2-3, the communication shell 74 interfaces a hardwired pipeline or hardwired-pipelines 44 to the framework-services layer 72. Because each hardwired pipeline 44 is different and, therefore, typically has different interface specifications, the communication shell 74 is typically different for each hardwired pipeline. Consequently, in this embodiment, one provides design adjustments to create a unique version of the communication shell 74 for each hardwired pipeline 44. The designer provides these design adjustments by writing a unique communication-shell template 132 for each hardwired pipeline. Of course the group of communication-shell templates $132_{1,1}$-$132_{1,n}$ corresponds only to the version of the framework-services layer 72 that is defined by the template $130_1$; consequently, if there are multiple versions of the framework-services layer 72 that are compatible with the platform 1, then the library section $140_1$ includes a respective group of n communication-shell templates 132 for each version of the framework-services layer.

Furthermore, the library section $140_1$ includes a configuration template $138_1$, which defines for the other templates in this library section (and possibly for the hardwired-pipeline templates 134 in the section 142) configuration constants having designer-selectable values as discussed above in conjunction with the configuration template 138 of FIG. 5.

In addition, each template within the library section $140_1$ includes, or is associated with, a respective template description $144_1$-$152_1$. The descriptions $144_1$-$150_{1,n}$ describe the operational and other parameters of the circuitry that the respective templates $121_1$, $128_1$, $130_1$, and $132_{1,1}$-$132_{1,n}$ respectively define. Similarly, the template description $152_1$ describes the settable parameters in the configuration template $138_1$, the values that these parameters can have, and the meanings of these values. Examples of parameters that a template description $144_1$-$150_{1,n}$ may describe include the width of the data bus and the depths of FIFO buffers that the circuit defined by the corresponding template includes, the latency of the circuit, and the type and precision of the values received and generated by the circuit. An example of a settable parameter and the associated selectable values that the description $152_1$ may describe is BUS_WIDTH, which represents the width of the interface between the communication interface 80 and the bus connector 56 (FIGS. 2-3), where BUS_WIDTH =0 sets this interface to thirty-two bits and BUS_WIDTH =1 sets this interface to sixty-four bits.

Each of the template descriptions $144_1$-$152_1$ may be embedded within the template $121_1$, $128_1$, $130_1$, $132_1$-$132_{1,n}$, and $138_1$ to which it corresponds. For example, the IAL template description $146_1$ may be embedded within the interface-adapter-layer template $128_1$ as extensible markup language (XML) tags or comments that are readable by both a human and the host processor 12 (FIG. 1) as discussed below in conjunction with FIGS. 10-14.

Alternatively, each of the template descriptions $144_1$-$152_1$ may be disposed in a separate file that is linked to the template to which the description corresponds, and this file may be written in a language other than XML. For example, the top-level-template description $144_1$ may be disposed in a file that is linked to the top-level template $121_1$.

The section $140_1$ of the library 102 also includes a description $154_1$, which describes parameters specified by of the platform m=1. The host processor 12 (FIG. 1) may use the description $154_1$ to determine which platform(s) the library 102 supports as discussed below in conjunction with FIGS. 10-14. Examples of parameters that the description $154_1$ may describe include: 1) for each interface, the message specification, which lists the transmitted variables and the constraints for those variables, and 2) a behavior specification and any behavior constraints. Messages that the host processor 12 (FIG. 1) sends to the pipeline units 50 (FIG. 2) and that the pipeline units send among themselves are further discussed in previously incorporated U.S. Patent Publication No. 2004/0181621. Examples of other parameters that the description $154_1$ may describe include the size and resources (e.g., the number of multipliers and the amount of available memory) that the platform specifies for the PLICs that compose a compatible pipeline accelerator 14 (FIG. 1). Furthermore, like the template descriptions $144_1$-$152_{1,n}$, the platform description $154_1$ may be written in XML or in another language.

Still referring to FIGS. 6A and 6B, the section 142 of the library 102 includes n hardwired-pipeline templates $134_1$-$134_n$, which each define a respective hardwired pipeline $44_1$-$44_n$ (FIGS. 1-3). As discussed above in conjunction with FIG. 5, because the templates $134_1$-$134_n$ are platform independent (the corresponding communication-shell templates $132_{m,1}$-$132_{m,n}$ respectively define the specified interfaces between the pipelines 44 and the framework-services layer 70, the library 102 stores only one template 134 for each hardwired pipeline 44. That is, each hardwired pipeline 44 does not require a separate template 134 for each platform m that the library 102 supports. As discussed in previously incorporated U.S. patent application Ser. No. 11/243,509, an advantage of this top-down design is that one need generate only a single template 134 to define a respective hardwired pipeline 44, not m templates.

Furthermore, each hardwired-pipeline template 134 includes, or is associated with, a respective template description $156_1$-$156_n$, which describes parameters of the hardwired-pipeline 44 that the template defines. Examples of parameters that a template description $156_1$-$156_n$ may describe include the type (e.g., floating point or integer) and precision of the data values that the corresponding hardwired pipeline 44 can receive and generate, and the latency of the pipeline. Like the template descriptions $144_1$-$152_1$, each of the descriptions $156_1$-$156_n$ may be respectively embedded within the hardwired-pipeline template $134_1$-$134_n$ to which the description corresponds as, e.g., XML tags, or may be disposed in a separate file that is linked to the corresponding hardwired-pipeline template.

Still referring to FIGS. 6A and 6B, alternate embodiments of the library 102 are contemplated. For example, instead of each template within each library section $140_1$-$140_m$ being associated with a respective description 144-152, each library section $140_1$-$140_m$ may include a single description that describes all of the templates within that library section. For example, this single description may be embedded within or linked to the top-level template 121 or to the configuration template 138. Furthermore, although each library section $140_1$-$140_m$ is described as including a respective communication-shell template 132 for each hardwired-pipeline template 134 in the library section 142, each section 140 may include fewer communication-shell templates, at least some of which are compatible with, and thus correspond to, more than one pipeline template 134. In an extreme, each library section $140_1$-$140_m$ may include only a single communication-shell template 132, which is compatible with all of the hardwired-pipeline templates 134 in the library section 142. In addition, the library section 142 may include respective versions of each pipeline template 134 for each communication-shell template 132 in the library sections $140_1$-$140_m$.

FIG. 7 is a block diagram of the software-object library 104 of FIG. 4 according to an embodiment of the invention.

The library 104 includes software objects $160_1$-$160_q$, at least some of which can cause the host processor 12 (FIG. 1) to perform in software the same functions that respective ones of the hardwired pipelines $44_1$-$44_n$ (FIGS. 2-3) can perform in hardware. For example, if the pipeline $44_1$ squares a value v ($v^2$) input to the pipeline, then a corresponding software object $160_1$ can cause the host processor 12 to square an input value v ($v^2$). The software objects $160_1$-$160_q$ may be directly executable by the host processor 12, or may cause the host processor to generate corresponding programming code that the host processor can execute. Furthermore, the software objects $160_1$-$160_q$ may be written in any conventional programming language such as $C^{++}$. Because object-oriented software architectures are known, further details of the software objects 160 are omitted for brevity.

The library 104 also includes respective object descriptions $162_1$-$162_q$ of the software objects $160_1$-$160_q$. The object descriptions 162 may describe parameters and other features of the software objects 160, such as the function(s) that they cause the host processor 12 (FIG. 1) to perform, and the latency and the type and precision of the values accepted and generated by the host processor 12 while performing the function(s). Furthermore, the descriptions 162 may be written in a conventional language, such as XML, that the host processor 12 recognizes, and may be embedded, e.g., as comment tags, within the respective software objects 160 or may be contained within separate files that correspond to the respective software objects.

Referring to FIGS. 1 and 7, as discussed below in conjunction with FIGS. 10-14, the software objects 160 provide the host processor 12 flexibility in configuring the pipeline accelerator 14, and in reconfiguring the peer-vector machine 10 in the invent of a failure. For example, suppose that the configuration data 100 calls for instantiating eight hardwired pipelines 44 on the accelerator 14, but the accelerator has room for only seven pipelines. The host processor 12 may execute a software object that corresponds to the eighth pipeline so as to perform the function that the eighth pipeline otherwise would have performed. Or, suppose that the configuration data 100 calls for instantiating a pipeline 44 that performs a function (e.g., sin (v)), but no such pipeline is available. The host processor 12 may execute a software object 160 so as to perform the function.

FIG. 8 is a block diagram of the circuit-definition library 106 of FIG. 4 according to an embodiment of the invention.

The library 106 includes circuit-definition files $170_1$-$170_p$, which each define a respective circuit for instantiation on one more PLICs (FIGS. 2-3) of the pipeline accelerator 14 (FIG. 1) in terms of templates from the accelerator-template library 102 (FIG. 4). To define a circuit for instantiation on a single PLIC, the circuit file 170 identifies from the template library 102 (FIGS. 4 and 6) the respective top-level template 121, interface-adapter-layer template 128, framework-services-layer template 130, communication-shell template 132, hardwired-pipeline-template(s) 134, configuration template 138, and corresponding lower-level templates that define the circuitry to be instantiated on that PLIC. And if the PLIC is to include multiple hardwired-pipelines 44, then the file 170 defines the interconnections between these pipelines. To define a circuit for instantiation on multiple PLICs, the circuit file 170 identifies for each PLIC the templates that define the circuitry to be instantiated or that PLIC, and also defines the interconnections between the PLICs. An example of a circuit defined by a circuit file 170 is described below in conjunction with FIG. 11.

The library 106 also includes circuit descriptions $172_1$-$172_p$ that correspond to the circuit-definition files $170_1$-$170_p$. A description 172 typically describes the function (e.g., $y=x^2+z^3$) performed by the circuit that the corresponding file 170 detects, and the operating parameters and other features of the circuit, such as the latency and the type and precision of the values accepted and generated by each PLIC that composes the circuit. The description 172 may also identify the platform(s) with which the corresponding circuit is compatible, and may include values for the constants defined by the configuration template(s) 138 (FIGS. 5-6B) that the circuit definition file 170 identifies. Furthermore, each of the circuit descriptions 170 may be written in a conventional language, such as XML, that the host processor 12 (FIG. 1) recognizes, and may be embedded (e.g., as comment tags) within a respective circuit-description file 170 or may be contained within a separate file that is linked to the respective circuit-description file.

Files similar to the circuit-definition files 170 and a tool for generating these files are disclosed in previously incorporated U.S. patent application Ser. No. 11/243,509. Furthermore, although described as defining circuits for instantiation on one or more PLICs, some of the circuit-definition files 170 may define circuits for instantiation on an ASIC.

Figure 9:
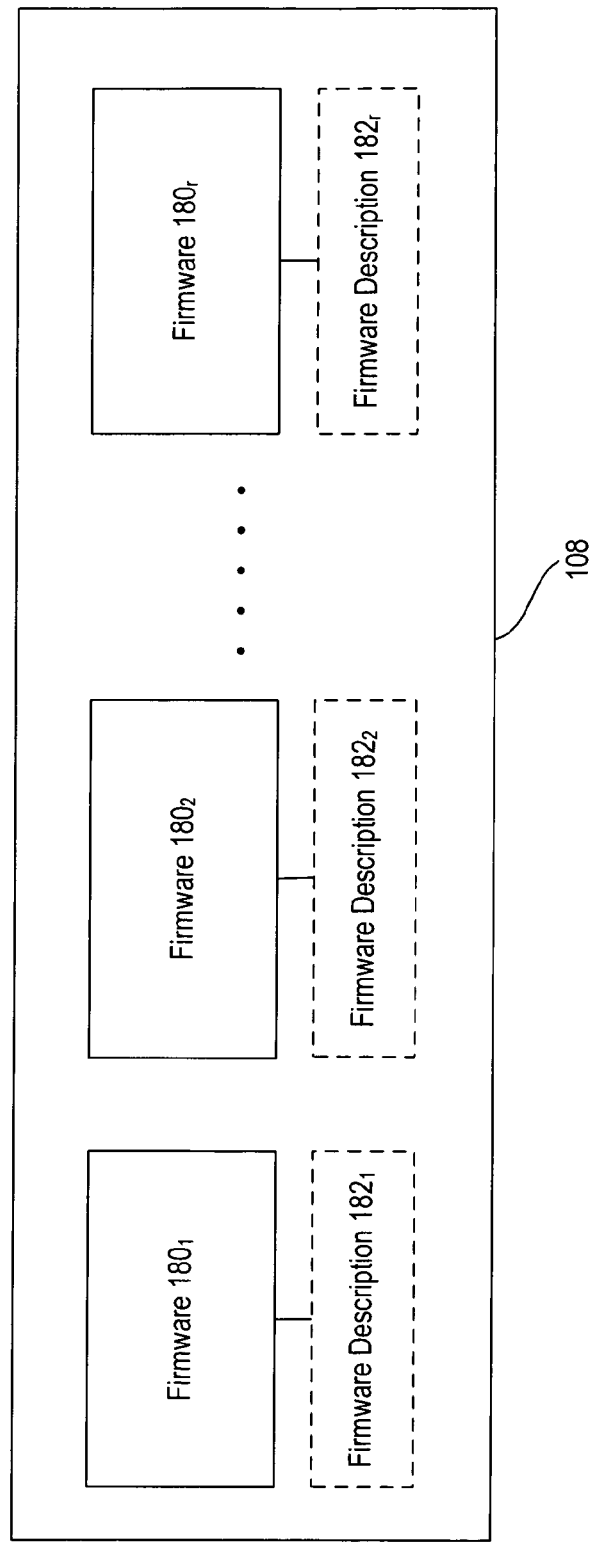
FIG. 9 is a block diagram of the accelerator-firmware library of FIG. 4 according to an embodiment of the invention.

FIG. 9 is a block diagram of the accelerator-firmware library 108 of FIG. 4 according to an embodiment of the invention.

The library 108 includes firmware files $180_1$-$180_r$, each of which, when downloaded by a PLIC, configures the PLIC to instantiate a respective circuit. As described above in conjunction with FIGS. 2-3, the respective circuit typically includes an interface-adapter layer 70, framework-services layer 72, communication shell 74, and one or more hardwired pipelines 44, although the circuit may have a different topology. A PLIC synthesizing and routing tool (not shown) may generate one or more of the firmware files 180 from templates in the accelerator-template library 102 (FIG. 4), or in another manner.

The firmware files $180_1$-$180_r$ are the only files within the accelerator/host-processor-configuration registry 40 (FIG. 4) that can actually configure a PLIC to instantiate a circuit. That is, although the templates in the library 102 (FIG. 4) and the circuit-definition files 170 in the library 106 (FIG. 4) define circuits, the configuration manager (not shown in FIG. 9) executed by the host processor 12 (FIG. 1) cannot instantiate such a defined circuit on the pipeline accelerator 14 (FIG. 1) until the respective template(s) and/or circuit-definitions files are converted into one or more corresponding firmware files 180 using, for example, a PLIC synthesizing and routing tool (not shown).

Still referring to FIG. 9, the library 108 also includes respective descriptions $182_1$-$182_r$ of the firmware files $180_1$-$180_r$. Each description 182 typically describes the function (e.g., $y=x^2+z^3$) performed by the circuit that the corresponding firmware file 180 can instantiate, and the parameters and other features of the circuit, such as the latency and the type and precision of the values accepted and generated by the circuit. The description 182 may also identify the platform(s) with which the corresponding circuit is compatible, and may also identify the type(s) of PLIC on which the circuit can be instantiated. Furthermore, the descriptions 182 may be written in a conventional language, such as XML, that the host processor 12 (FIG. 1) recognizes, and may be embedded (e.g., as comment tags) within the respective firmware files 180 or may be contained within separate files that are linked to the respective firmware files.

Figure 10:
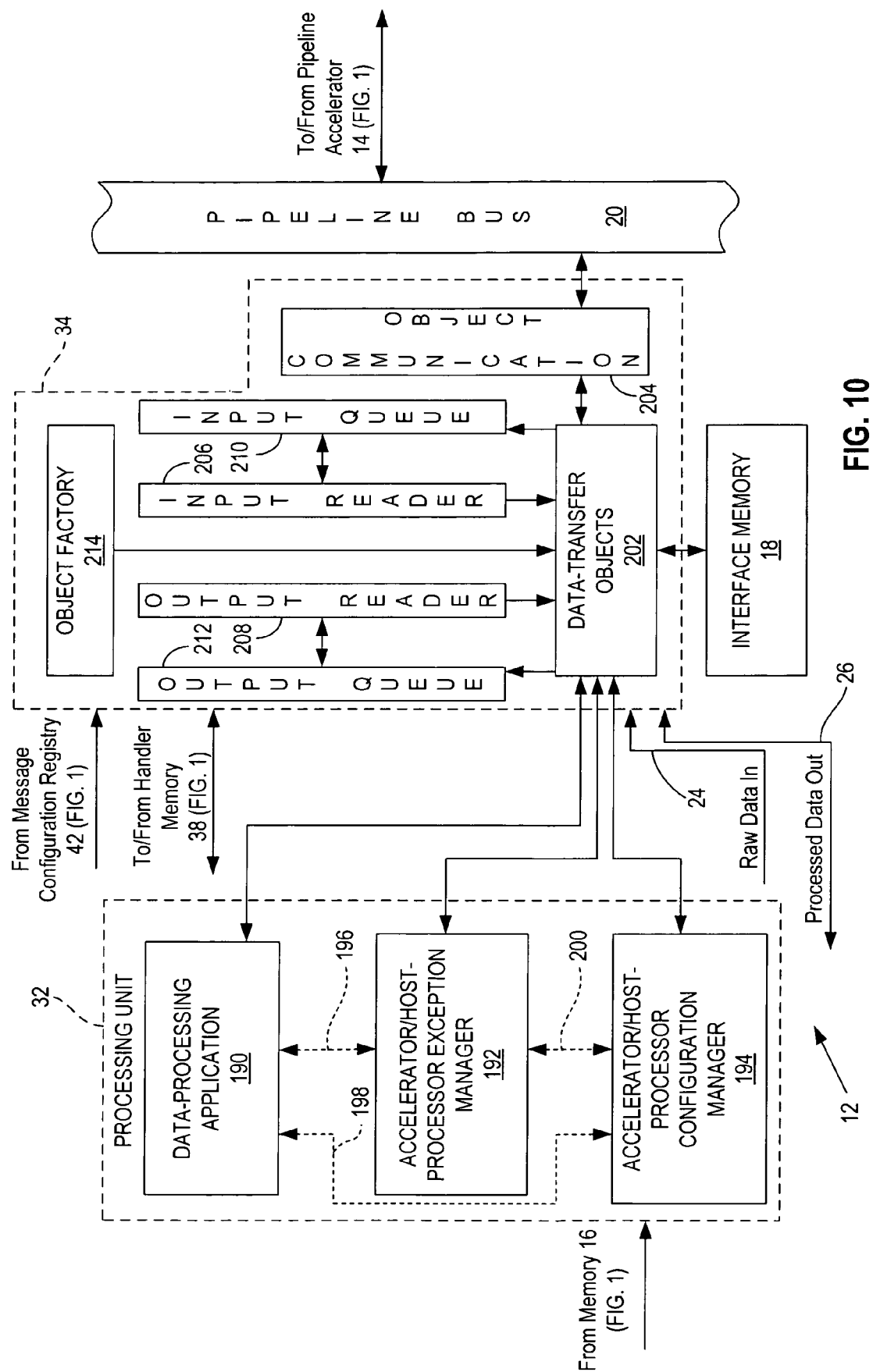
FIG. 10 is a functional block diagram of the host processor of FIG. 1 according to an embodiment of the invention.

FIG. 10 is a functional block diagram of the host processor 12, the interface memory 18, and the pipeline bus 20 of FIG. 1 according to an embodiment of the invention. Generally, the processing unit 32 executes one or more software applications, and the message handler 34 executes one or more software objects (different from the software objects in the library 104 of FIG. 4) that transfer data between the software application(s) and the pipeline accelerator 14 (FIG. 1). Splitting the data-processing, data-transferring, and other functions among different applications and objects allows for easier design and modification of the host-processor software. Furthermore, although in the following description a software application is described as performing a particular function, it is understood that in actual operation, the processing unit 32 or message handler 34 executes the software application and performs this function under the control of the application. Moreover, although in the following description a software object is described as performing a particular function, it is understood that in actual operation, the processing unit 32 or message handler 34 executes the software object and performs this function under the control of the object. In addition, although in the following description a manager application (e.g., configuration manager) is described as performing a particular function, it is understood that in actual operation, the processing unit 32 or message handler 34 executes the manager application and performs this function under the control of the manager application.

Still referring to FIG. 10, the processing unit 32 executes at least one data-processing application 190, an accelerator-exception-manager application (hereinafter the exception manager) 192, and an accelerator-configuration-manager application (hereinafter the configuration manager) 194, which are collectively referred to as the processing-unit applications. Furthermore, the exception and configuration managers 192 and 194 are executed by the processing unit 32, and are thus different from the exception and configuration managers 88 and 90 disposed on the PLIC 60 of FIG. 3.

The data-processing application 190 processes data in cooperation with the pipeline accelerator 14 (FIG. 1). For example, the data-processing application 190 may receive raw sonar data via the port 24, parse the data, and send the parsed data to the accelerator 14, and the accelerator may perform a fast Fourier transform (FFT) on the parsed data and return the FFT output data to the data-processing application for further processing.

The exception manager 192 handles exception messages from the pipeline accelerator 14 (FIG. 1), and may detect and handle exceptions that result from the operation of the host processor 12. The PLIC exception manager(s) 88 (FIG. 3) typically generate the exception messages that the exception manager 192 receives from the pipeline accelerator 14.

And, as discussed further below in conjunction with FIGS. 11-14, the configuration manager 194 downloads the firmware files 180 from the library 106 (FIGS. 4 and 9) into accelerator the firmware memory or memories 22 (FIGS. 1-3) during initialization of the peer-vector machine 10 (FIG. 1), and may also reconfigure the pipeline accelerator 14 (FIG. 1) after the initialization in response to, e.g., a malfunction of the peer-vector machine. The configuration manager 194 may perform additional functions as described below in conjunction with FIGS. 11-14.

The processing-unit applications 190, 192, and 194 may communicate with each other directly as indicated by the dashed lines 196, 198, and 200, or may communicate with each other via the data-transfer objects 202, which are described below. Furthermore, the processing-unit applications 190, 192, and 194 communicate with the pipeline accelerator 14 (FIG. 1) via the data-transfer objects 202.

The message handler 34 executes the data-transfer objects 202, a communication object 204, and input and output reader objects 206 and 208, and may also execute input- and output-queue objects 210 and 212. The data-transfer objects 202 transfer data between the communication object 204 and the processing-unit applications 190, 192, and 194, and may use the interface memory 18 as one or more data buffers to allow the processing-unit applications and the pipeline accelerator 14 (FIG. 1) to operate independently. For example, the memory 18 allows the accelerator 14, which is often faster than the data-processing application 190, to operate without "waiting" for the data-processing application. The communication object 204 transfers data between the data-transfer objects 202 and the pipeline bus 20. The input- and output-reader objects 206 and 208 control the data-transfer objects 202 as they transfer data between the communication object 204 and the processing-unit applications 190, 192, and 194. And, when executed, the input- and output-queue objects 210 and 212 cause the input- and output-reader objects 206 and 208 to synchronize this transfer of data according to a desired priority Furthermore, during initialization of the peer-vector machine 10 (FIG. 1), the message handler 34 instantiates and executes an object factory 214, which instantiates the data-transfer objects 202 from configuration data stored in the message-configuration registry 42 (FIG. 1). The message handler 34 also instantiates the communication object 204, the input- and output-reader objects 206 and 208, and the input- and output-queue objects 210 and 212 from the configuration data stored in the message-configuration registry 42. Consequently, one can design and modify the objects 202-212, and thus their data-transfer parameters, by merely designing or modifying the configuration data stored in the registry 42. This is typically less time consuming than designing or modifying each software object individually.

The structure and operation of the processing unit 32 and the message handler 34 are further described in previously incorporated U.S. Patent Publication No. 2004/0181621.

The operation of the exception manager 192 and the configuration manager 194 is further discussed below in conjunction with FIGS. 11-14 according to an embodiment of the invention.

Figure 11:
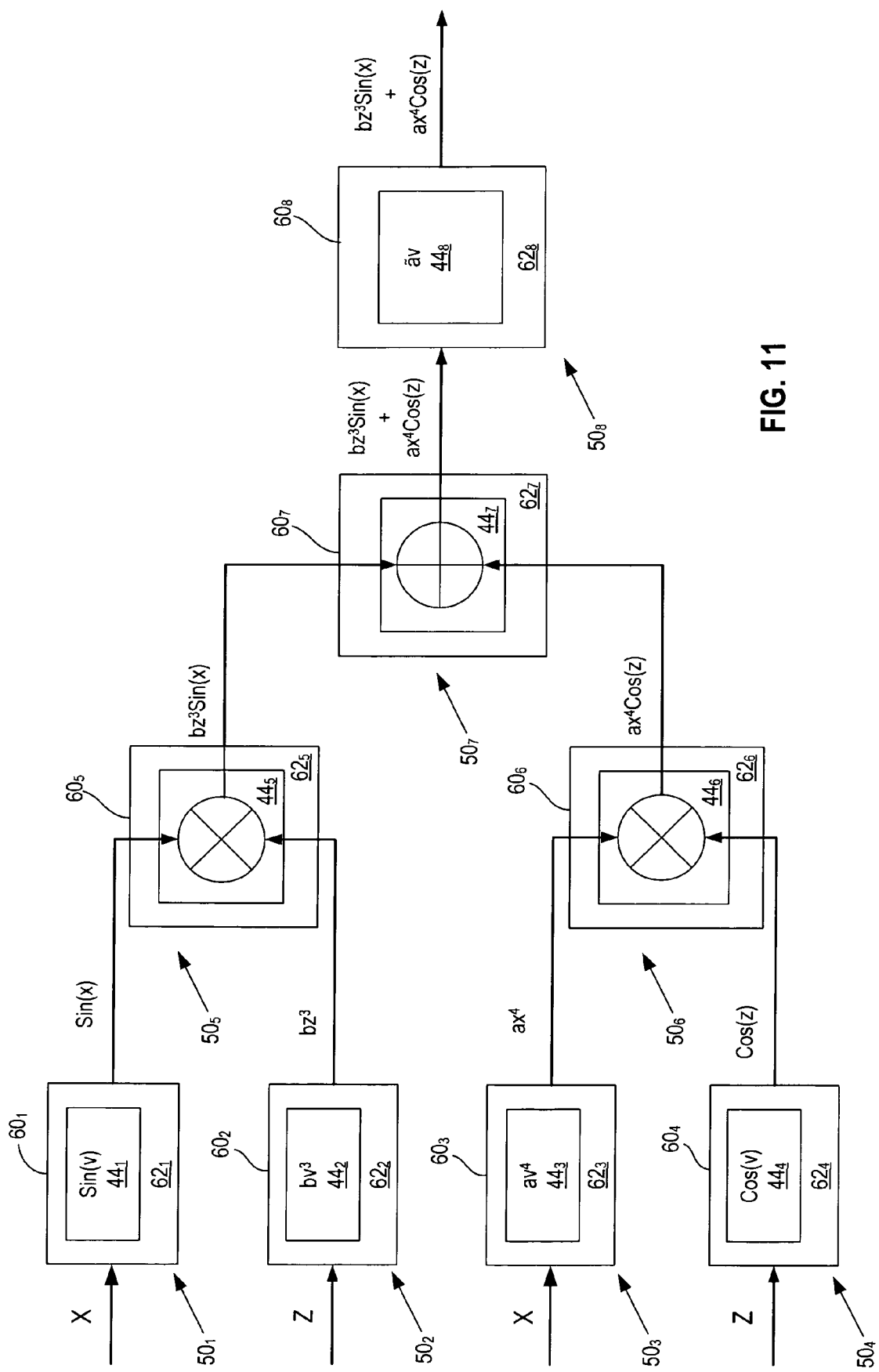
FIG. 11 is a schematic block diagram of a circuit defined by a file in the circuit-definition library of FIGS. 4 and 8 for instantiation on the pipeline accelerator of FIG. 1 according to an embodiment of the invention.

FIG. 11 is a block diagram of a circuit 220 that is designed for instantiation on the pipeline accelerator 14 (FIG. 1) according to an embodiment of the invention. The clock signals, power signals, and other signals are omitted from FIG. 11 for clarity.

During operation, the circuit 220 generates, in a pipelined fashion, a stream of output values y from streams of input values x and z, which are related by the following equation:

$$y=\sqrt{ax^4\cos(z)+bz^3\sin(x)} \quad (1)$$

where each x and z is a sixty-four bit floating-point number, each y is a sixty-four bit floating-point number, and a and b are respective sixty-four bit floating-point constant coefficients. Therefore, the circuit 220 is designed for instantiation on a pipeline accelerator 14 (FIG. 1) that supports a platform that specifies sixty-four-bit data transfers and busses.

As initially designed, the circuit 220 includes eight hard-wired pipelines $44_1$-$44_8$ (pipelines $44_5$ and $44_6$ are the same) and eight hardware-interface layers $62_1$-$62_8$ respectively instantiated on eight PLICs $60_1$-$60_8$. The pipeline $44_1$ on the PLIC $60_1$ receives the stream of input values x and generates a stream of values sin(x). Similarly, the pipeline $44_2$ on the PLIC $60_2$ receives the stream of input values z and generates a stream of values $bz^3$, the pipeline $44_3$ on the PLIC $60_3$ receives the stream x and generates a stream $ax^4$, and the pipeline $44_4$ on the PLIC $60_4$ receives the stream z and generates a stream cos(z). Furthermore, the pipeline 445 on the PLIC $60_5$ receives from the PLICs $60_1$ and $60_2$ the streams sin(x) and $bz^3$ and generates a stream of values $bz^3$ sin(x), and the pipeline $44_6$ on the PLIC $60_6$ receives from the PLICs $60_3$ and $60_4$ the streams $ax^4$ and cos(z) and generates a stream $ax^4$ cos(z). In addition, the pipeline $44_7$ on the PLIC $60_7$ receives from the PLICs $60_5$ and $60_6$ the streams $bz^3$ sin(x) and $ax^4$ cos(z) and generates a stream $bz^3$ sin(x)+$ax^4$ cos(x). Finally, the pipeline $44_8$ on the PLIC $60_8$ receives from the PLIC $60_7$ the stream $bz^3$ sin(x)+$ax^4$ cos(x) and generates a stream $y=\sqrt{ax^4\cos(z)+bz^3\sin(x)}$ per equation (1).

Figure 12:
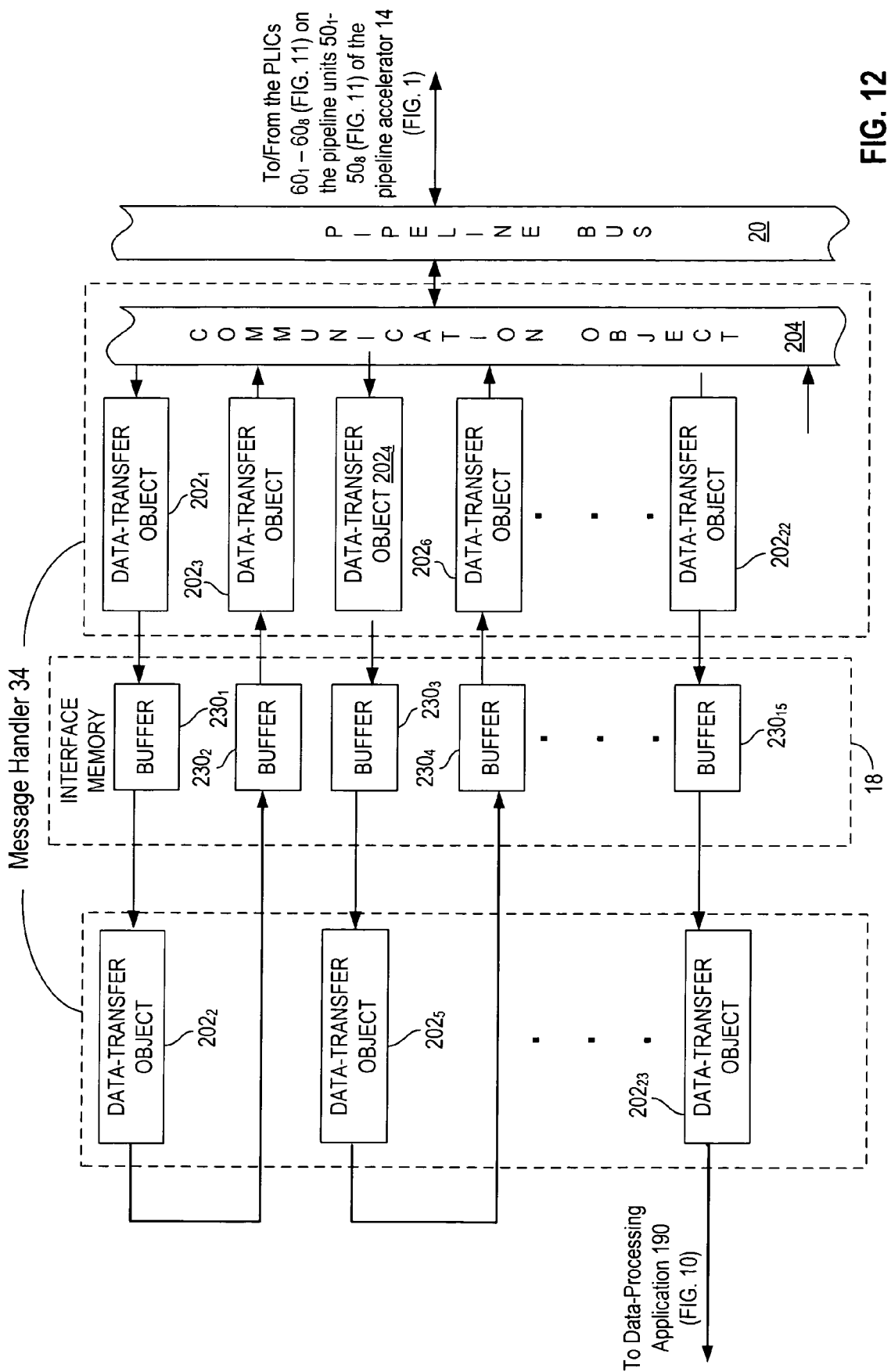
FIG. 12 is a functional block diagram of the data paths between the PLICs of FIG. 11 according to an embodiment of the invention.

FIG. 12 is a block diagram of the data paths between the PLICs $60_1$-$60_8$ of FIG. 11 according to an embodiment of the invention, and is further described below.

Figure 13:
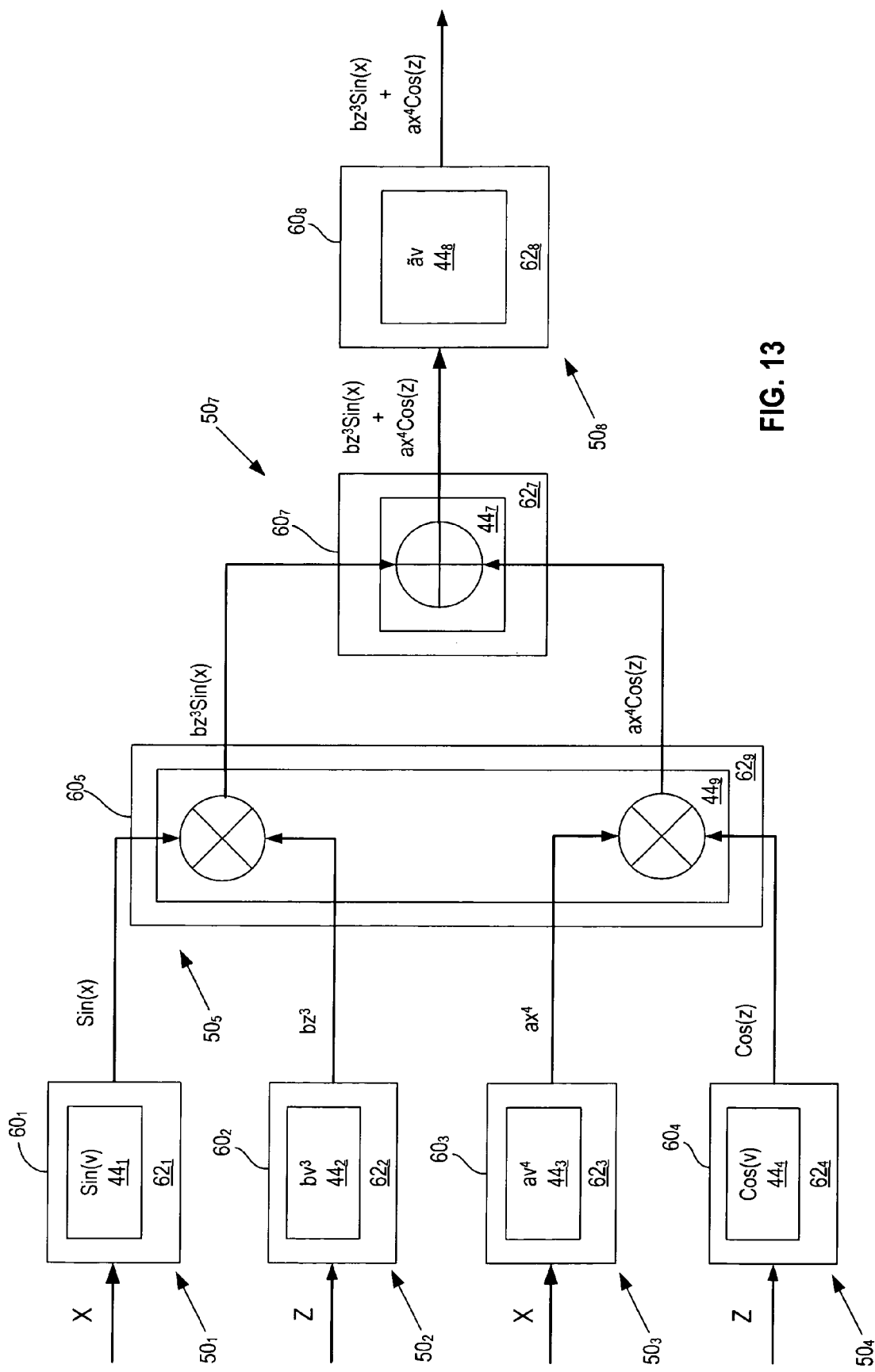
FIG. 13 is a schematic block diagram of the circuit of FIG. 11 instantiated on fewer PLICs according to an embodiment of the invention.

FIG. 13 is a block diagram of the circuit 220 modified for instantiation on seven PLICs 60 instead of eight PLICs (as shown in FIG. 11) according to an embodiment of the invention, and is further described below.

Figure 14:
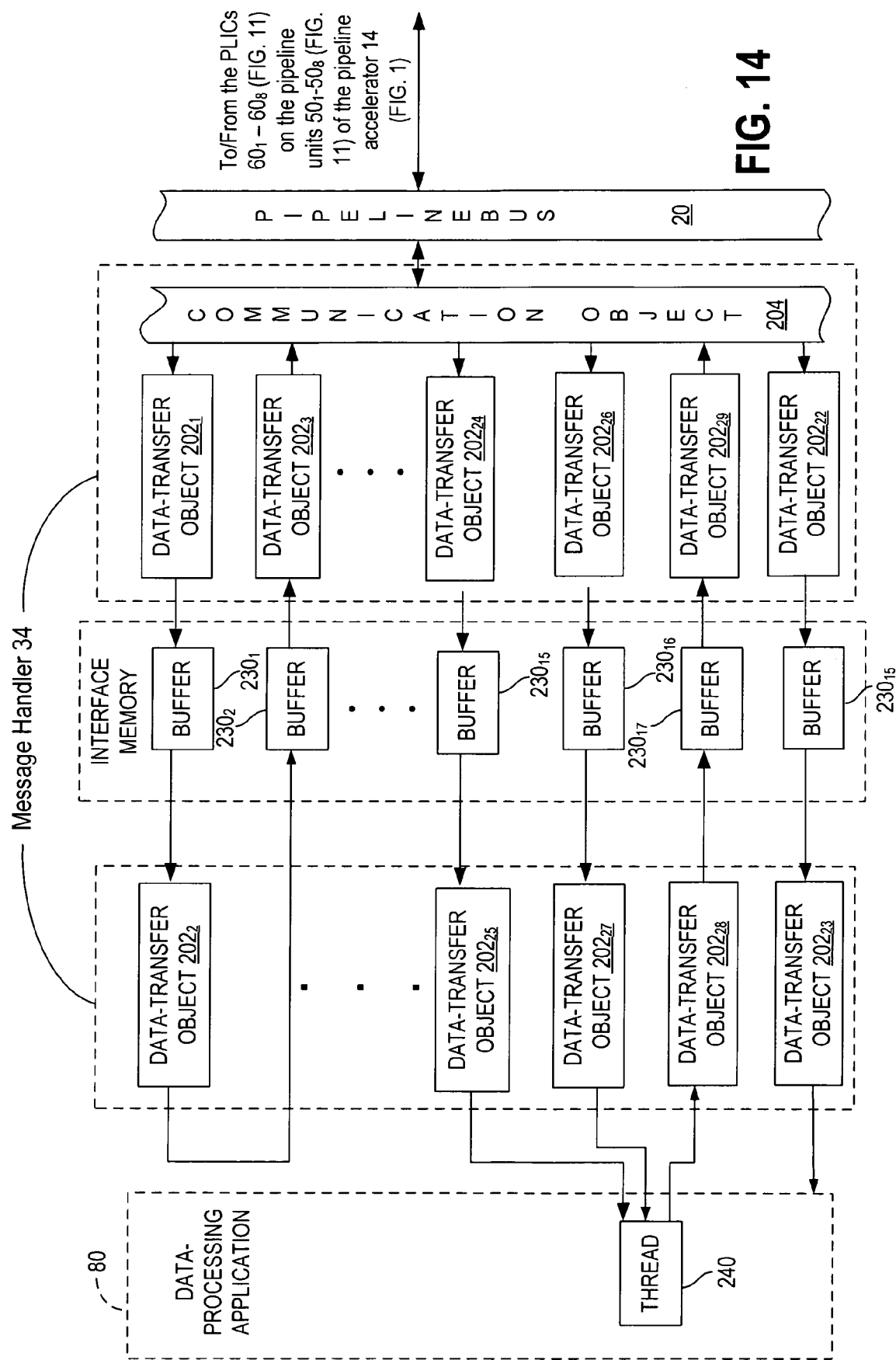
FIG. 14 is a functional block diagram of the data paths between the portions of the circuit of FIG. 11 instantiated on the pipeline accelerator of FIG. 1 and a software-application thread that the processing unit of FIG. 10 executes to perform the function of an un-instantiated portion of the circuit according to an embodiment of the invention.

FIG. 14 is a block diagram of the data paths between the PLICs $60_1$ and $60_3$-$60_8$ of FIG. 11 and a software-application thread that effectively replaces the pipeline $44_2$ of FIG. 11 according to an embodiment of the invention, and is further described below.

Operation of the Configuration Manager 194 (FIG. 10) During Initialization of the Peer-Vector Machine 10 (FIG. 1)

The operation of the configuration manager 194 during the initialization of the peer-vector machine 10 (FIG. 1) is discussed in conjunction with FIGS. 10-14 according to embodiments of the invention. Although a number of detailed operational examples are provided below, the following is a general overview of the configuration manager 194 and some of the advantages that it may provide.

The configuration manager 194 initializes the peer-vector machine 10 (FIG. 1) when the machine is "turned on," restarted, or is otherwise reset.

At the beginning of the initialization, the configuration manager 194 determines the desired configuration of the pipeline accelerator 14 (FIG. 1) from the configuration data 100 (FIG. 4) within the accelerator/host-processor-configuration registry 40 (FIGS. 1 and 4), and also determines the physical composition (e.g., the number of pipeline units 50 (FIGS. 2-3) and the platform(s) that they support) of the pipeline accelerator.

Therefore, because the configuration manager 194 configures the pipeline accelerator 14 (FIG. 1) in response to the configuration data 100 (FIG. 4), one can typically change the accelerator configuration merely by "turning off" the peer-vector machine 10 (FIG. 1), changing the configuration data, and then restarting the machine.

Furthermore, by determining the composition of the pipeline accelerator 14 (FIG. 1) at the beginning of each initialization, the configuration manager 194 can detect changes to the accelerator (e.g., the removal or addition of a pipeline unit 50 (FIGS. 2-3), and can often "fit" the by the configuration data 100 (FIG. 4) into an altered accelerator. That is, the configuration manager 194 can often detect a physical change to the accelerator 14 and modify the specified circuit instantiation(s) accordingly so that the circuit(s) can fit onto the modified accelerator and process data as desired despite the change.

EXAMPLE 1

Referring to FIGS. 10-12, in this example, the configuration data 100 (FIG. 4) points to a circuit-definition file 170 (FIGS. 4 and 8) that defines the circuit 220 of FIG. 11, and instructs the configuration manager 194 to instantiate the circuit 220 on the pipeline accelerator 14 (FIG. 1) according to this circuit-definition file.

At the beginning of the initialization of the peer-vector machine 10 (FIG. 1), the configuration manager 194 reads the configuration data 100, determines from the configuration data the desired configuration of the pipeline accelerator 14 (FIG. 1), and also determines the physical composition of the pipeline accelerator. Regarding the former determination, the configuration manager 194 first determines that it is to read the circuit-definition file 170 pointed to by the configuration data 100. Next, the configuration manager 194 reads the file 170, and determines that the manager is to instantiate on each of the eight PLICs $60_1$-$60_8$ a respective pipeline $44_1$-$44_8$ (pipelines $44_5$ and $44_6$ are the same) and hardware-interface layer $62_1$-$62_8$. Regarding the determination of the composition of the pipeline accelerator 14, the pipeline bus 20 (FIG. 1) may include slots for receiving pipeline units 50 (FIGS. 2-3), and the configuration manager 194 may, for each slot, read a conventional indicator associated with the slot, or use another technique, for determining whether or not a pipeline unit is inserted into the slot.

Next, the configuration manager 194 determines whether the configuration indicated by the configuration data 100 (FIG. 4) is compatible with the physical composition of the pipeline accelerator 14 (FIG. 1). Specifically, in this example, the configuration manager 194 determines whether the accelerator 14 includes eight pipeline units 50 each having a respective one of the PLICs $60_1$-$60_8$ on which the configuration manager can instantiate the pipeline units $44_1$-$44_8$ and the hardware-interface layers $62_1$-$62_8$.

In this example, the configuration manager 194 determines that the desired configuration of the pipeline accelerator 14 (FIG. 1) is compatible with the physical composition of the accelerator.

Consequently, the configuration manager 194 next determines whether the pipeline accelerator 14 (FIG. 1) supports the platform(s) that circuit-definition file 170 specifies as being compatible with the circuit 220. More specifically, the configuration manager 194 reads from the file 170 the specified platform(s), and reads from the platform-identifier memory 54 (FIGS. 2-3) on each pipeline unit 50 (FIGS. 2-3) the identity/identities of the platform(s) that the pipeline units support. Then, the configuration manager 194 compares the specified platform(s) from the file 170 to the identified platform(s) from the memories 54. If at least one platform from the file 170 matches at least one platform from the memories 54, then the configuration manager 194 determines that the platform(s) supported by the pipeline accelerator 14 is/are compatible with the platform(s) specified by the file 170. In this example, the file 170 indicates that the circuit 220 is compatible with platform 1 (FIGS. 6A and 6B), and the platform-identifier memory 54 on each pipeline unit 50 indicates that the respective pipeline unit is compatible with this platform; consequently, the configuration manager 194 determines that the pipeline accelerator 14 is compatible with the platform (i.e., platform 1) specified by the circuit-definition file 170.

In this example, the configuration manager 194 determines that the pipeline accelerator 14 (FIG. 1) supports the platform (s) that the circuit-definition file 170 (FIG. 8) specifies.

Therefore, the configuration manager 194 next determines whether the firmware library 108 (FIGS. 4 and 9) includes firmware files 180 that, when downloaded by the PLICs $60_1$-$60_8$, will respectively instantiate on these PLICs the pipelines $44_1$-$44_8$ and the hardware-interface layers $62_1$-$62_8$. The configuration manager 194 makes this determination by reading the firmware descriptions 182 in the library 108. For example, if the description 182, indicates that the corresponding firmware file 180, will instantiate the pipeline 44, within a hardware-interface layer (i.e., the hardware-interface layer $62_1$) that is compatible with platform 1 then the configuration manager 194 matches the firmware file $180_1$ to the PLIC $60_1$ in the circuit 220.

In this example, the configuration manager 194 determines that the library 108 (FIGS. 4 and 8) contains firmware files $180_1$-$180_7$ for each of the PLICs $60_1$-$60_8$—the firmware file $180_5$ is for both the PLICs $60_5$ and $60_6$—because the pipelines $44_5$-$44_6$ are the same.

Consequently, the configuration manager 194 next downloads these firmware files $180_1$-$180_7$ (FIG. 8) to the PLICs $60_1$-$60_8$ (FIG. 11) via the pipeline bus 20. Techniques for downloading these firmware files are described in previously incorporated U.S. Patent Publication No. 2004/0170070.

Then, the configuration manager 194 determines the topology that the circuit-definition file 170 (FIG. 7) specifies for interconnecting the PLICs $60_1$-$60_8$ of the circuit 220 (FIG. 11).

In this example, the circuit-description file 170 (FIG. 7) specifies that the PLICs $60_1$-$60_8$ (FIG. 11) are to be interconnected via the host processor 12 (FIG. 1) as shown FIG. 12.

Therefore, referring to FIG. 12, the configuration manager 194 instantiates in the interface memory 18 buffers $230_1$-$230_{15}$, and instantiates in the message handler 34 data-transfer objects $202_1$-$202_{23}$.

Referring to FIG. 11, the PLIC $60_1$ needs a path on which to provide the stream of values sin(x) to the corresponding input pin of the PLIC $60_5$. The configuration manager 194 forms this path by instantiating in the interface memory 18 the buffers $230_1$ and $230_2$, and by instantiating in the message handler 34 the data-transfer objects $202_1$, $202_2$, and $202_3$. In operation, the PLIC $60_1$ provides the stream of values sin(x) to the data-transfer object $202_1$ via the pipeline bus 20 and communication object 204, and the data-transfer object $202_2$ sequentially loads these values into the buffer $230_1$. Then, the data-transfer object $202_2$ sequentially transfers the values sin(x) from the buffer $230_1$ to the buffer $230_2$ in first-in-first-out fashion, and the data-transfer object $202_3$ transfers the values sin(x) from the buffer $230_2$ in first-in-first-out fashion to the corresponding input pin of the PLIC $60_5$ via the communication object 204 and the pipeline bus 20. The configuration manager 194 forms the remaining paths interconnecting the PLICs in a similar manner. Therefore, in operation the PLIC $60_2$ transfers the values $bz^3$ to the corresponding input pin of the PLIC $60_5$ via the data-transfer objects $202_4$-$202_6$ and the buffers $230_3$-$230_4$, the PLIC $60_3$ transfers the values $ax^4$ to the corresponding input pin of the PLIC $60_6$ via the data-transfer objects $202_7$-$202_9$ and the buffers $230_5$-$230_6$, and so on. Finally, the PLIC $60_8$ provides the values y= $\sqrt{ax^4\cos(z)+bz^3\sin(x)}$ to the data-processing application 190 via the data-transfer objects $202_{22}$ and $202_{23}$ and the buffer $230_{15}$. Furthermore, the PLICs $60_1$-$60_4$ may receive the values x and z via the raw-data input port 24, or from the data-processing application 190 via respective buffers 230 and data-objects 202 (omitted from FIG. 12 for brevity) that the configuration manager 194 instantiates in response to the circuit-definition file 170. For example, the data-processing application 190 may provide the values x to a first data-transfer object 202 (not shown), which loads the values x into a buffer 230 (not shown). Then, a second data-transfer object 202 (not shown) unloads the values x from the buffer 230 and provides these values to the corresponding input pins of the PLICs $60_1$ and $60_3$ via the communication object 204 and the pipeline bus 20.

After instantiating the data-transfer objects $202_1$-$202_{23}$, and the buffers $230_1$-$230_{15}$ (and possibly the data-transfer objects and buffers described in the preceding paragraph), the configuration manager 194 sends to the configuration managers 88 (FIG. 3) on each of the PLICs $60_1$-$60_8$ any soft-configuration data specified by the circuit-definition file 170. For example, the configuration manager 194 may send to the configuration managers 88 on the PLICs $60_2$ and $60_3$ soft-configuration data that sets the values of the constants a and b. Or, the configuration manager 194 may send to the configuration managers 88 on the PLICs $60_1$ and $60_4$ soft-configuration data that causes the respective exception managers 86 on these PLICs to indicate exceptions for values of sin(x) and cos(x) outside of the ranges $-1 \leq \sin(x) \leq 1$ and $-1 \leq \cos(x) \leq 1$, respectively. In one embodiment, the configuration manager 194 sends this soft-configuration data to the PLICs $60_1$-$60_8$ via one or more data-transfer objects 202 that the configuration manager has instantiated for this purpose.

After soft configuring the PLICs $60_1$-$60_8$ and configuring any remaining portions of the pipeline accelerator 14 (FIG. 1), the interface memory 18, and the message handler 34, the configuration manager 194 exits the initialization mode and relinquishes control of the peer-vector machine 10 (FIG. 1) back to the host processor 12, which enters an operational mode where the PLICs $60_1$-$60_8$ cooperate as described above to generate a stream of output values $y=\sqrt{ax^4\cos(z)+bz^3\sin(x)}$ in a pipelined fashion.

EXAMPLE 2

Referring to FIGS. 10-13, this example is similar to Example 1, except that the configuration manager 194 determines that the pipeline accelerator 14 (FIG. 1) includes fewer than eight PLICs 60, and thus arranges the circuit 220 to "fit" onto the available PLICs.

More specifically, the configuration manager 194 determines that the pipeline accelerator 14 includes only seven PLICs $60_1$-$60_5$ and $60_7$-$60_8$.

The configuration manager 194 sends this information to a circuit-design tool such as the circuit-design tool described in previously incorporated U.S. patent application Ser. No. 11/243,509. The tool may be executed by the host processor 12 (FIG. 1), and the configuration manager 194 may communicate with the tool via one or more data-transfer objects 202.

In a first embodiment, the circuit-design tool determines that the circuit 220 cannot fit onto the pipeline accelerator 14 (FIG. 1), and notifies the configuration manager 194, which generates an appropriate error message. The host processor 12 (FIG. 1) may display this message via a display or by another conventional technique. In response to this message, an operator (not shown) can install into the peer-vector machine 10 (FIG. 1) an additional pipeline unit 50 (FIG. 2) that includes the PLIC $60_6$ so that the configuration manager 194 can then instantiate the circuit 220 on the pipeline accelerator 14 as described above in Example 1.

Referring to FIGS. 6A and 6B, and FIGS. 10-13, in a second embodiment, the circuit-design tool (not shown) accesses the library 102 and discovers a template $134_9$ for a dual-multiplication pipeline $44_9$ (two multipliers in a single pipeline), and determines from the corresponding hardwired-pipeline-template description $156_9$ that this pipeline (along with a corresponding hardware-interface layer $62_9$) can fit into the PLIC $60_5$ and can give the circuit 220 the desired operating parameters (as included in the circuit-definition file 170 that defines the circuit 220). Then, using this dual-multiplication pipeline $44_9$, the tool redesigns the circuit 220 as shown in FIG. 13 for instantiation on seven PLICS $60_1$-$60_5$ and $60_7$-$60_8$, generates a circuit-definition file 170 corresponding to the redesigned circuit 220, and stores this circuit-definition file in the library 106 (FIGS. 4 and 8). The configuration manager 194 then instantiates the redesigned circuit 220 in a manner similar to that discussed above in conjunction with Example 1. If, however, the firmware library 108 includes no firmware file 180 for instantiating the dual-multiplier pipeline $44_9$ on the PLIC $60_5$, then the circuit design tool or the configuration manager 194 may notify an operator (not shown), who manually generates this firmware file and loads it into the firmware library. Alternatively, the circuit-design tool or the configuration manager 194 may cause a PLIC synthesizing and routing tool (not shown) to generate this firmware file from the appropriate templates in the accelerator-template library 102 (FIGS. 4 and 6A and 6B). Once this firmware file is generated and stored in the library 108, the configuration manager 194 proceeds to instantiate the redesigned circuit 220 of FIG. 13 in a manner similar to that discussed above in conjunction with Example 1.

Alternate embodiments of Example 2 are contemplated. For example, although Example 2 describes placing two multipliers on a single PLIC $60_5$, the configuration manager 194 and/or the circuit-design tool (not shown) may fit the functions of multiple ones of the other pipelines $44_1$-$44_8$ of the circuit 220 on a single PLIC, including placing on a single PLIC a single pipeline that generates y in equation (2). Moreover, the circuit-design tool (not shown) may instantiate multiple interconnected ones of the pipelines $44_1$-$44_8$ (FIG. 11) on a single PLIC instead of searching for existing pipelines that each perform multiple ones of the functions performed by the pipelines $44_1$-$44_8$.

EXAMPLE 3

Referring to FIGS. 10-14, this example is similar to Example 2, except that the configuration manager 194 effectively replaces a hardwired pipeline 44 with a software object 160 (FIG. 7) from the software-object library 104 (FIGS. 4 and 7).

More specifically, the configuration manager 194 determines that the pipeline accelerator 14 (FIG. 1) includes only seven PLICs $60_1$-$60_6$ and $60_8$.

The configuration manager 194 next reads the software-object descriptions 162 (FIG. 7) and determines that the software object $160_1$ can sum two values such as $bz^3 \sin(x)$ and $ax^4 \cos(z)$.

Consequently, referring to FIGS. 11 and 14, the configuration manager 194 instantiates the software object $160_1$ (FIG. 7) as part of a data-processing application thread 240 that, after the instantiation of the remaining portions of the circuit 220 on the pipeline accelerator 44 (FIG. 1), receives $bz^3 \sin(x)$ and $ax^4 \cos(z)$ from the PLICs $60_5$ and $60_6$, respectively, sums corresponding values from these two streams, and then provides $bz^3 \sin(x)+ax^4 \cos(z)$ to the PLIC $60_8$. More specifically, the thread 240 receives $bz^3 \sin(x)$ from the PLIC $60_5$ via the pipeline 20, communication object $20_4$, data-transfer object $202_{24}$, buffer $230_{15}$, and data-transfer object $202_{25}$. Similarly, the thread 240 receives $ax^4 \cos(z)$ from the PLIC $60_6$ via the pipeline 20, communication object 204, data-transfer object $202_{26}$, buffer $230_{16}$, and data-transfer object $202_{27}$. And the thread provides $bz^3 \sin(x)+ax^4 \cos(z)$ to the PLIC $60_8$ via the data-transfer object $202_{28}$, buffer $230_{17}$, data-transfer object $202_{29}$, communication object 204, and pipeline 20. The configuration manager 194 instantiates these data-transfer objects and buffers as described above in conjunction with Example 1. Furthermore, the operation and instantiation of application threads such as the thread 240 are described in previously incorporated U.S. Patent Publication No. 2004/0181621.

Next, the configuration manager 194 proceeds to instantiate the remaining portions of the circuit 220 on the pipeline accelerator 14 (FIG. 1) in a manner similar to that discussed above in conjunction with Example 1.

Although Example 3 describes replacing a single pipeline $44_6$ with a data-processing application thread 240 that executes a single corresponding software object 160 (FIG. 7), the configuration manager 194 may replace any number of the pipelines $44_1$-$44_8$ in the circuit 220 (FIG. 11) with one or more threads that execute corresponding software objects. Moreover, the configuration manager 194 may combine the concepts described in conjunction with Examples 2 and 3 by fitting multiple pipelines 44 or multiple pipeline functions on each of one or more PLICs, and replacing other pipelines 44 with one or more data-processing application threads that execute corresponding software objects 160.

EXAMPLE 4

Referring to FIGS. 10-12 and 14, this example is similar to Example 1, except that the configuration manager 194 determines that the pipeline accelerator 14 (FIG. 1) does not support the platform(s) that circuit-definition file 170 (FIG. 8) specifies as being compatible with the circuit 220.

In a first embodiment, the configuration manager 194 generates an error message, and, in response, an operator (not shown) replaces the pipeline units 50 (FIG. 2) that do not support the specified platform(s) with pipeline units that do support the specified platform(s).

In a second embodiment, the configuration manager 194 instantiates a circuit that performs the same function as the circuit 220 (i.e., generates y in equation (1)) by downloading into the available PLICs firmware files 180 (FIG. 9) that instantiate the hardwired pipelines $44_1$-$44_8$ with respective hardware-interface layers 62 that are compatible with the platform(s) supported by the pipeline accelerator 14 (FIG. 1). If the library 108 (FIGS. 4 and 8) does not contain such firmware files 180, then the configuration manager 194 and/or a circuit-design tool such as that described in previously incorporated U.S. patent application Ser. No. 11/243,509 may generate these firmware files from the templates in the library 102 (FIGS. 4 and 6A and 6B) as discussed above in conjunction with Example 2.

In a third embodiment, the configuration manager 194 instantiates the function of the circuit 220 (i.e., generates y in equation (1)) in one or more data-processing application threads 240 as discussed above in conjunction with Example 3.

In a fourth embodiment, the configuration manager 194 instantiates a portion of the circuit 220 on the pipeline accelerator 14 per the above described second embodiment of Example 4, and effectively instantiates the remaining portion of the circuit 220 in one or more data-processing application threads per the preceding paragraph.

EXAMPLE 5

Referring to FIGS. 10-12, and 14, this example is similar to Example 1, except that the configuration manager 194 determines that the library 108 (FIGS. 4 and 8) lacks at least one of the firmware files $180_1$-$180_7$ for the PLICs $60_1$-$60_8$ (the firmware file $180_5$ corresponds to both the PLICs $60_5$ and $60_6$).

In a first embodiment, the configuration manager 194 generates an error message, and, in response, an operator loads the missing firmware file(s) 180 (FIG. 8) into the library 108 (FIGS. 4 and 8) so that the configuration manager can proceed with instantiating the circuit 220 on the PLICs $60_1$-$60_8$ as discussed above in conjunction with Example 1.

In a second embodiment, the configuration manager 194 and/or a circuit-design tool such as that described in previously incorporated U.S. patent application Ser. No. 11/243, 509 generates these firmware files from the templates (FIGS. 6A and 6B) in the library 102 (FIGS. 4 and 6A and 6B) as discussed above in conjunction with Example 2. Then, the configuration manager 194 loads these generated firmware files 180 into the library 108, and instantiates the circuit 220 on the PLICs $60_1$-$60_8$ as discussed above in conjunction with Example 1.

In a third embodiment, the configuration manager 194 instantiates the function of a pipeline 44 corresponding to a missing firmware file 180 in a data-processing application thread 240 as discussed above in conjunction with Example 3.

In a fourth embodiment, the configuration manager 194 instantiates on the pipeline accelerator 14 (FIG. 1) a portion of the circuit 220 per the above-described second embodiment of Example 5, and effectively instantiates the remaining portion of the circuit 220 in one or more data-processing application threads 240 per the preceding paragraph.

EXAMPLE 6

Referring to FIGS. 10-11, this example is similar to Example 1, except that the circuit-definition file 170 (FIG. 8) that defines the circuit 220 specifies that the PLICs $60_1$-$60_8$ are to be "directly" interconnected via the pipeline bus 20 (FIG. 1). That is, the PLIC $60_1$ provides the stream of values $\sin(x)$ to the PLIC $60_5$ without going through the message handler 34 and memory 18 as shown in FIG. 12.

In a first embodiment, the corresponding firmware files $180_1$-$180_7$ (file $180_5$ is used twice) instantiate the communication interfaces 80 (FIG. 3) of the PLICs $60_1$-$60_8$ to generate and send message objects (not shown) that identify the recipient PLIC and to recognize and receive messages from specified sender PLICs. Such message objects are described in previously incorporated U.S. Patent Publication No. 2004/0181621. In summary, these message objects each include an address header that identifies the destination PLIC or PLICs. For example, the communication interface 80 (FIG. 3) of the PLIC $60_1$ generates message objects that carry values $\sin(x)$ to the PLIC $60_5$. These message objects each include an address header that includes the address of the PLIC $60_5$. Therefore, when the communication interface 80 of the PLIC $60_5$ detects on the pipeline bus 20 (FIG. 1) a message object having this address, the interface uploads this message object from the bus. The remaining PLICs $60_2$-$60_8$ receive and generate message objects in a similar manner.

In a second embodiment, the configuration manager 194 soft configures the communication interfaces 80 (FIG. 3) of the PLICs $60_1$-$60_8$ to receive and generate message objects per the preceding paragraph by sending appropriate soft-configuration data to the configuration managers 88 (FIG. 3) of the PLICs as discussed above in conjunction with Example 1.

Referring to FIGS. 4-14, other embodiments of the peer vector machine 10 (FIG. 1) are contemplated. For example, instead of pointing to a circuit-definition file 170 in the circuit-definition library 106, the configuration data 100 may include meta-data that describes an algorithm, such as the algorithm represented by equation (1), and the configuration manager 194 may cause the peer vector machine 10 to implement the algorithm based on this meta-data. More specifically, the configuration manager 194 may first determine the attributes of the peer vector machine 10 as previously described. Next, based on the meta-data and the determined attributes of the peer vector machine 10, the configuration manager 194 may define an implementation of the algorithm that is compatible with the platform(s) supported by, and the components present within, the peer vector machine. The configuration manager 194 may define the implementation using one or more templates from the library 102, one or more software objects 160 from the library 104, one or more circuit-definition files from the library 106, and one or more firmware files 180 from the library 108, or using any combination of these items. Then, the configuration manager 194 may instantiate the implementation on the peer vector machine 10 using any technique described above, any other technique(s), or any combination of these described/other techniques. Of course the configuration data 100 may include both meta-data that describes an algorithm and a pointer to a circuit-definition file 170 that defines a circuit for implementing the algorithm. If for some reason the circuit defined by the file 170 is incompatible with the peer vector machine 10, then the configuration manager 194 may define an implementation of the algorithm per above. Moreover, one may write such meta-data manually, or use a tool, such as that described in previously incorporated U.S. patent application Ser. Nos. 11/243,509 and 11/243,506, to generate the meta-data.

Reconfiguration of the Peer-Vector Machine 10 of FIG. 1 by the Configuration Manager 194 While the Peer-Vector Machine is Operating (Dynamic Reconfiguration)

Dynamic reconfiguration of the peer-vector machine 10 (FIG. 1) by the configuration manager 194 (FIG. 10) is discussed below in conjunction with FIGS. 10-12 and 14-16 according to embodiments of the invention. Although a number of detailed examples are provided below, the following is a general overview of dynamic reconfiguration and some of the advantages that it provides.

Conventional fault-tolerant computing machines (not shown) often have built-in redundancy such that if one portion of the machine fails during operation, another, redundant, portion can take over for the failed part. For example, if a processor fails, then a redundant processor can take over for the failed processor. Typically, if one wants to add redundancy for a component of the machine, then he adds to the machine a like redundant component. For example, if one wants to add redundancy to a bank of processors, then he typically adds to the machine at least one redundant processor. The same is true for other components such as hard drives.

The configuration manager 194 can render the peer-vector machine 10 (FIG. 1) fault tolerant in a manner that is often more flexible and less costly than a conventional redundancy scheme. For example, as discussed below, the configuration manager 194 may transfer a function previously performed by a failed pipeline unit 50 (FIG. 2) of the pipeline accelerator 14 (FIG. 1) to the host processor 12 (FIG. 1), and vice versa. That is, the host processor 12 may provide redundancy to the accelerator 14, and vice versa. Consequently, instead of adding redundant processing units to the host processor 12, it may be less expensive and less complex from a design perspective to add extra pipeline units 50 to the accelerator 14, where the configuration manager 194 can use these extra units to provide redundancy to both the host processor 12 and the accelerator. Or, instead of adding extra pipeline units 50 to the accelerator 14, it may be less expensive and less complex from a design perspective to add extra processing units 32 to the host processor 12, where the configuration manager 194 can use these extra processing units to provide redundancy to both the host processor and the accelerator. Of course the peer-vector machine 10 may include both extra processing units 32, and pipeline units 50 and may also include extras of other components of the host-processor 12 and the accelerator 14.

EXAMPLE 7

The PLIC $60_1$ (FIG. 11), or another portion of the pipeline unit $50_1$ on which the PLIC $60_1$ is disposed, experiences a "soft" failure while the peer-vector machine 10 (FIG. 1) is operating, and the circuit 220 is executing equation (1). Examples of a soft failure include, e.g., corrupted configuration firmware or soft-configuration data stored in the PLIC $60_1$, a buffer overflow, and a value sin(x) that is generated by the pipeline $44_1$ on the PLIC $60_1$ but that is out of the predetermined range $-1 \leq \sin(x) \leq 1$.

First, the accelerator-exception manager 192 detects the failure of the PLIC $60_1$.

In one embodiment, the exception manager 192 detects the failure in response to an exception received from the exception manager 86 on board the PLIC $60_1$. For example, because $-1 \leq \sin(x) \leq 1$, then the exception manager 86 may be programmed to generate an exception if a value generated by the pipeline 44, is less than $-1$ or greater than 1. Or, the exception manager 86 may be programmed to send an exception if an input buffer for the value x on the data memory 58 overflows.

In a second embodiment, the exception manager 192 detects the failure in response to an improper value of data provided to or generated by the pipeline $44_1$ on the PLIC $60_1$. For example, the exception manager 192 may periodically analyze the stream of values x provided to the PLIC $60_1$, or the stream of values sin(x) provided by the PLIC $60_1$, and detect a failure of the PLIC $60_1$ if any of the analyzed values are less than $-1$ or greater than 1.

In a third embodiment, the exception manager 192 detects the failure in response to the PLIC $60_1$ failing to provide the stream of values sin(x). For example, per the previous paragraph, the exception manager 192 may periodically analyze the stream of values sin(x) provided by the PLIC $60_1$, and detect a failure of the PLIC $60_1$ if the PLIC $60_1$ stops generating sin(x) despite continuing to receive the stream of input values x.

Next, the exception manager 192 notifies the configuration manager 194 that the PLIC $60_1$ has experienced a soft failure.

In response to this notification, the configuration manager 194 first halts the processing of data by the PLICs $60_1$-$60_8$ and any related data-processing applications 190 that the processor unit 32 is executing. Examples of a related data-processing application 190 include an application that generates the values x or z or that receives and processes the values y.

Next, if the configuration manager 194 previously loaded soft-configuration data into the PLIC $60_1$ during initialization of the peer-vector machine 10 (FIG. 1), then the configuration manager reloads this data into the PLIC $60_1$ and restarts the processing of data by the PLICs $60_1$-$60_8$ and any related data-processing applications 190 that the processing unit 32 is executing.

If the exception manager 192 detects no failure of the PLIC $60_1$ after the restart, then the configuration manager 194 allows the PLICs $60_1$-$60_8$ and any related data-processing applications 190 to continue processing data.

But if the configuration manager 194 did not load soft-configuration data into the PLIC $60_1$ during initialization of the peer-vector machine 10, or if the exception manager 192 detects a failure of the PLIC $60_1$ after the restart, then the configuration manager again halts the processing of data by the PLICs $60_1$-$60_8$ and any related data-processing applications 190.

Next, the configuration manager 194 causes the PLIC $60_1$ to re-download the firmware file 180 (FIG. 9) that the PLIC $60_1$ downloaded during initialization of the peer-vector machine 10 (FIG. 1), and restarts the PLICs $60_1$-$60_8$ and any related data-processing applications 190 for a second time.

If the exception manager 192 detects no failure of the PLIC $60_1$ after the restart, then the configuration manager 194 allows the PLICs $60_1$-$60_8$ and any related data-processing applications 190 to continue processing data.

But if the exception manager 192 detects a failure of the PLIC $60_1$ after the second restart, then the configuration manager 194 again halts the processing of data by the PLICs $60_1$-$60_8$ and any related data-processing applications 190.

Then, the configuration manager 194 determines whether the pipeline accelerator 14 (FIG. 1) includes an extra PLIC 60 that is the same as or is similar to the PLIC $60_1$. The extra PLIC may be a PLIC that is reserved to replace a failed PLIC, or may merely be a PLIC that is unused. Also, the extra PLIC may be on an extra pipeline unit 50, or on a pipeline unit 50 that includes other, no-extra PLICs.

If the pipeline accelerator 14 (FIG. 1) does include an extra PLIC, then the configuration manager 194 causes the extra PLIC to download the same firmware file 180 (FIG. 9) previously downloaded by the PLIC $60_1$ during initialization of the peer-vector machine 10 (FIG. 1) and prior to the second restart.

Next, the configuration manager 194 restarts the PLICs $60_2$-$60_8$, the extra PLIC, and any related data-processing applications 190 such that the extra PLIC takes the place of the failed PLIC $60_1$ in the circuit 220.

If the exception manager 192 detects no failure of the extra PLIC after the third restart, then the configuration manager 194 allows the PLICs $60_2$-$60_8$, the extra PLIC, and any related data-processing applications 190 to continue processing data.

But if the pipeline accelerator 14 (FIG. 1) includes no extra PLIC, or if the exception manager 192 detects a failure of the extra PLIC after the third restart, then the configuration manager 194 halts for a fourth time the processing of data by the PLICs $60_1$-$60_8$ and any related data-processing applications 190 if the data processing is not already halted.

Then, if the pipeline accelerator 14 (FIG. 1) includes another extra PLIC, then the configuration manager 194 may replace the failed PLIC $60_1$ with this other extra PLIC, and restart the data processing as discussed above.

But if the pipeline accelerator 14 (FIG. 1) contains no other extra PLICs (or if these extra PLICs fail), then the configuration manager 194 determines whether the circuit 220 can "fit" into the remaining PLICs $60_2$-$60_8$ in a manner similar to that discussed above in conjunction with Example 2.

If the circuit 220 can "fit" into the remaining PLICs $60_2$-$60_8$, then the configuration manager 194 reinstantiates the circuit 220 on these remaining PLICs in a manner similar to that discussed above in conjunction with Example 2, and restarts the PLICs $60_2$-$60_8$ and any related data-processing applications 190.

If the exception manager 192 detects no failure of the reinstantiated circuit 220 after the restart, then the configuration manager 194 allows the PLICs $60_2$-$60_8$ and any related data-processing applications 190 to continue processing data.

But if the circuit 220 cannot fit into the PLICs $60_2$-$60_8$, or if exception manager 192 detects a failure of the reinstantiated circuit 220 after the restart, then the configuration manager 194 halts the processing of data by the PLICs $60_2$-$60_8$ and any corresponding data-processing applications 190 if the data-processing is not already halted.

Next, the configuration manager 194 reads the software-object descriptions 192 (FIG. 7) to determine whether the library 104 (FIGS. 4 and 7) includes a software object 160 (FIG. 7) that can generate sin(x).

If the library 104 (FIGS. 4 and 7) includes such a sin(x) software object 160 (FIG. 7), then the configuration manager 194 instantiates on the processing unit 32 a data-processor application thread that executes the object 160 for generating sin(x) in a manner similar to that discussed above in conjunction with Example 3 and FIG. 14, and restarts the data processing.

If the exception manager 192 detects no failure of the circuit 220 (includes the application thread executing the sin(x) software object 160) after the restart, then the configuration manager 194 allows the PLICs $60_2$-$60_8$, the sin(x) application thread that executes the sin(x) software object 160, and any related data-processing applications to continue processing data.

But if the library 104 (FIGS. 4 and 7) includes no sin(x) software object 160 (FIG. 4), then the configuration manager 194 generates an error message, in response to which an operator (not shown) may take corrective action such as replacing the PLIC $60_1$ or replacing the pipeline unit 50 on which the defective PLIC $60_1$ is disposed.

Still referring to FIGS. 3, 10, and 11, alternate embodiments of Example 7 are contemplated. For example, the configuration manager 194 may omit any number of the above-described steps, and perform the non-omitted steps in any order. An example, in response to a failure of the PLIC $60_1$, the configuration manager 194 may generate an application thread that executes a sin(x) software object 160 (FIG. 7) without first trying to reconfigure the PLIC $60_1$, to re-download the respective firmware file 180 (FIG. 9) to the PLIC $60_1$ to replace the PLIC $60_1$ with an extra PLIC, or to "fit" the circuit 220 on the remaining PLICs $60_2$-$60_8$. Furthermore, the exception manager 190 may be omitted, and the configuration manager 194 may directly detect the failure of one or more PLICs $60_1$-$60_8$. Moreover, although described as halting the PLICs $60_1$-$60_8$ and related data-processing applications 190 in response to a failure of one of the PLICs $60_1$-$60_8$, the configuration manager 194 may halt other portions of the peer-vector machine 10 as well, including halting the entire peer-vector machine.

EXAMPLE 8

Referring to FIGS. 3 and 10-11, in this example, a data-processing application 190 is generating y of equation (1) and experiences a failure while the peer-vector machine 10 (FIG. 1) is operating. Examples of such failure include, e.g., a mechanical failure of one or more processors that compose the processing unit 32, or the inability of the data-processing application 190 to process data at or above a specified speed.

First, the exception manager 192 detects the failure of the data-processing application 190.

In a first embodiment, the exception manager 192 detects the failure in response to an improper value of x or z being provided to the data-processing application 190, or in response to an improper value of y being generated by the application. For example, the exception manager 192 may periodically analyze the respective streams of values x and z provided to the data-processing application 190, or the stream of values y generated by the data-processing application, and detect a failure of the data-processing application if, e.g., the analyzed values are outside of a predetermined range or the data-processing application stops generating output values y despite continuing to receive the values x and z.

In a second embodiment, the exception manager 192 detects the failure in response to the frequency at which the data-processing application 190 generates the values y being below a predetermined frequency.

Next, the exception manager 192 notifies the configuration manager 194 that the data-procession application 190 has failed.

In response to this notification, the configuration manager 194 first halts the processing of data by the data-processing application 190 and any related PLICs 60 (FIG. 3) of the pipeline accelerator 14 (FIG. 1). Examples of a related PLIC include a PLIC that generates the input values x or z for the data-processing application 190 or that receive the values y from the application.

Next, if the failure is due to a mechanical failure of a portion of the processing unit 32, then the configuration manager 194 determines whether the data-processing application 190 can be loaded onto and run by another portion of the processing unit such as an extra processor.

If the data-processing application 190 can be loaded onto and run by another portion of the processing unit 32, then the configuration manager 194 loads the data-processing application onto the other portion of the processing unit 32, and restarts the application and any related PLICs.

If the exception manager 192 detects no failure of the data-processing application 190 after the restart, then the configuration manager 194 allows the application and any related PLICs to continue processing data.

But if the configuration manager 194 cannot load and run the data-processing application 190 on another portion of the processing unit 32, or if the exception manager 192 detects a failure of the application after the restart, then the configuration manager halts the processing of data by the application and any related PLICs 60.

Next, the configuration manager 194 attempts to instantiate on the pipeline accelerator 14 (FIG. 1) a circuit, such as the circuit 220, for generating the stream of values y of equation (1) in place of the failed data-processing application 190.

First, the configuration manager 194 determines whether the library 108 (FIGS. 4 and 9) includes a firmware file 180 (FIG. 9) that can instantiate such a circuit on a single PLIC 60.

If the library 108 (FIGS. 4 and 9) includes such a firmware file 180 (FIG. 9), then the configuration manager 194 downloads the file to a PLIC 60 of the pipeline accelerator 14 (FIG. 1), generates data-transfer objects 202 for transferring x and z to the PLIC and for transferring y from the PLIC, and starts the accelerator. Alternatively, the configuration manager 194 may omit some or all of the data-transfer objects 202 if the pipeline accelerator 14 receives x or z via the input port 24 or provides y via the output port 26.

If the exception manager 192 detects no failure of the single PLIC 60 after the start of the pipeline accelerator 14 (FIG. 1), then the configuration manager 194 allows the PLIC 60 and any related data-processing application 190 (e.g., to provide x or z to receive y from the PLIC 60) to continue processing data.

But if the library 108 (FIGS. 4 and 9) includes no such firmware file 180 (FIG. 9), then the configuration manager 194 determines whether the library 106 (FIGS. 4 and 8) includes a circuit-definition file 170 (FIG. 8) that describes a circuit, such as the circuit 220, for generating y of equation (1).

If the library 108 (FIGS. 4 and 9) includes such a circuit-definition file 170, then the configuration manager 194 downloads the corresponding firmware files 180 (FIG. 9) to the corresponding PLICs 60 of the pipeline accelerator 14 (FIG. 1). For example, if the file circuit-definition 170 describes the circuit 220 of FIG. 11, then the configuration manager 194 downloads the firmware files $180_1$-$180_7$ into the respective PLICs $60_1$-$60_8$ (the file $180_5$ is downloaded into both the PLICs $60_5$ and $60_6$ as discussed above in conjunction with Example 1). If however, the library 108 lacks at least one of the firmware files 180 corresponding to the circuit-definition file 170, then the configuration manager 194 may, as discussed above in conjunction with Example 5, generate the omitted firmware file from templates in the library 102 (FIGS. 4 and 6), store the generated firmware file in the library 108, and download the stored firmware file into the respective PLIC 60.

But if the library 106 (FIGS. 4 and 8) includes no such circuit-definition file 170 (FIG. 8), then the configuration manager 194 may use the circuit-design tool (not shown) described in previously incorporated U.S. patent application Ser. No. 11/243,509 to generate such a circuit-definition file as discussed above in conjunction with Example 5. Next, the configuration manager 194 generates (if necessary) and downloads the corresponding firmware files $180_1$-$180_7$ into the corresponding PLICs $60_1$-$60_8$ as described in the preceding paragraph.

After downloading the firmware files $180_1$-$180_7$ into the PLICs $60_1$-$60_8$, the configuration manager 194 instantiates the data-transfer objects $202_1$-$202_{21}$ (FIG. 12) as discussed above in conjunction with Example 1, and starts the PLICs $60_1$-$60_8$ and any related data-processing applications 190.

But if the configuration manager 194 cannot instantiate on the pipeline accelerator 14 (FIG. 1) a circuit for generating y of equation (1), then the configuration manager generates an error message in response to which an operator (not shown) can take corrective action. The configuration manager 194 may be unable to instantiate such a circuit because, e.g., the accelerator 14 lacks sufficient resources or does not support a compatible platform, or the library 102 (FIGS. 4 and 6) lacks the proper templates.

Still referring to FIGS. 3 and 10-11, alternate embodiments of Example 8 are contemplated. For example, the configuration manager 194 may omit any number of the above-described steps, and perform the unomitted steps in any order. Furthermore, the exception manager 190 may be omitted, and the configuration manager 194 may directly detect the failure of the data-processing application 190 that generates y of equation (1), and may directly detect the failure of any other portion of the peer-vector machine 10 (FIG. 1).

System Save, Restore, and Redundancy

Figure 15:
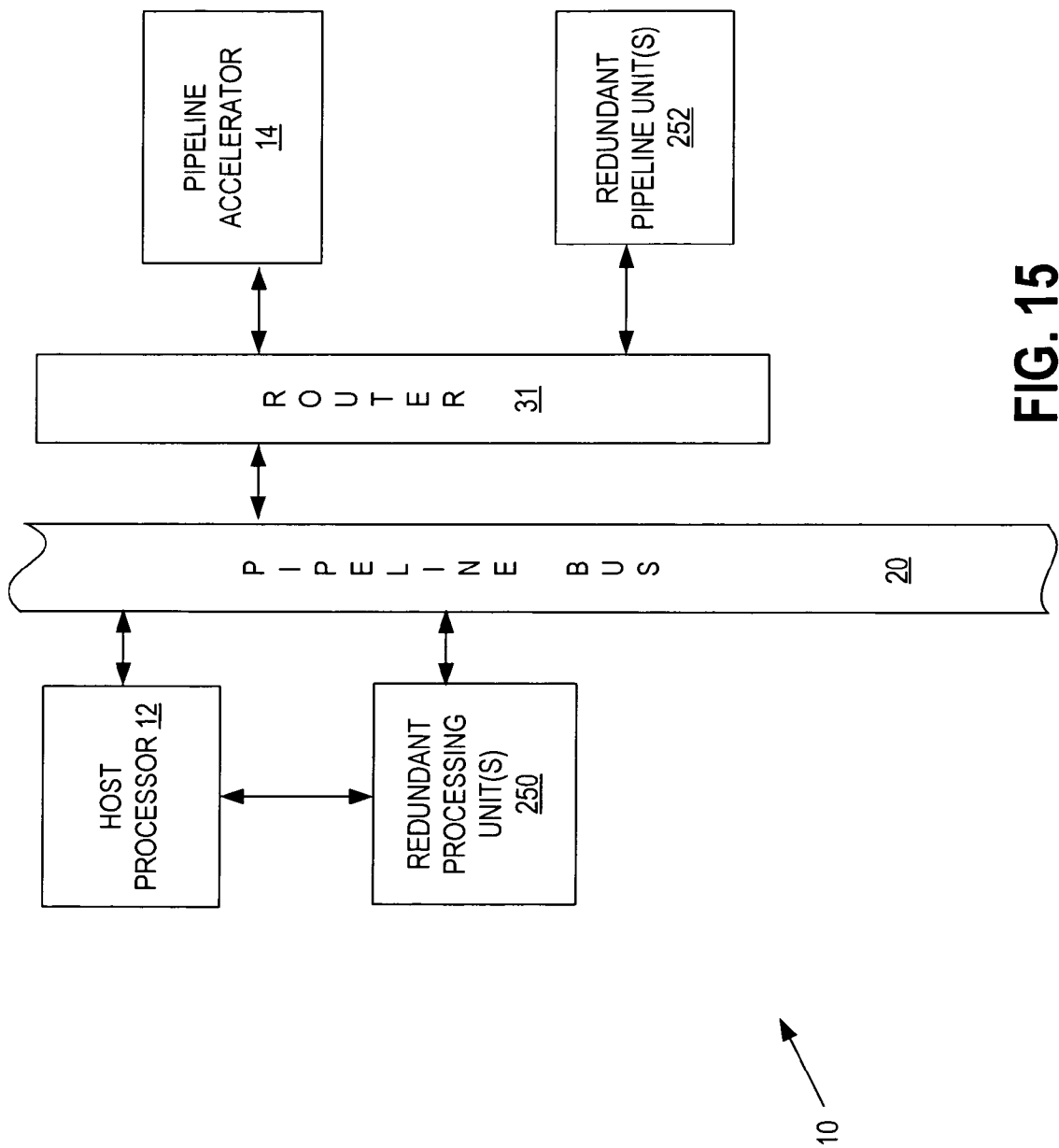
FIG. 15 is block diagram of a peer-vector computing machine having redundancy according to an embodiment of the invention.

FIG. 15 is a block diagram of the peer-vector machine 10, which, in addition to the host processor 12 and pipeline accelerator 14, includes at least one redundant processing unit 250 and at least one redundant pipeline unit 252 according to an embodiment of the invention.

The redundant processing units 250 and the redundant pipeline units 252 provide fault-tolerant capabilities in addition to the dynamic-reconfiguration capabilities described above in conjunction with Examples 7 and 8. For example, if a PLIC 60 (FIG. 3) in the pipeline accelerator 14 fails, then the configuration manager 194 (FIG. 10) may dynamically reconfigure a redundant PLIC (not shown) on a redundant pipeline unit 252 to replace the failed PLIC 60 in a manner that is similar to that described above in conjunction with Example 7. Similarly, if the processing unit 32 (FIG. 10) of the host processor 12 fails, then the configuration manager 194 may dynamically reconfigure a redundant processing unit 250 to replace the failed processing unit in a manner that is similar to that described above in conjunction with Example 8. In addition, the configuration manager 194 may dynamically reconfigure a redundant processing unit 250 to replace a failed portion of the pipeline accelerator 14, or may dynamically reconfigure one or more redundant PLICs on one or more of the redundant pipeline units 252 to replace a failed processing unit 32 or another failed portion of the host processor 12 in a manner that is similar to that described above in conjunction with Examples 7 and 8.

Referring to FIGS. 10-15 and Examples 7 and 8, the dynamic reconfiguration of the host processor 12 and the pipeline accelerator 14 may destroy the states of the, e.g., registers (not shown), in the host processor and in the pipeline accelerator. Consequently, once restarted after dynamic reconfiguration, the host processor 12 and pipeline accelerator 14 may need to reprocess all of the data processed prior to the failure that initiated the reconfiguration.

Unfortunately, the reprocessing of pre-failure data may adversely affect some applications of the peer-vector machine 10, such as the processing of data from a sonar array or other application where the peer-vector machine processes data in real time.

Figure 16:
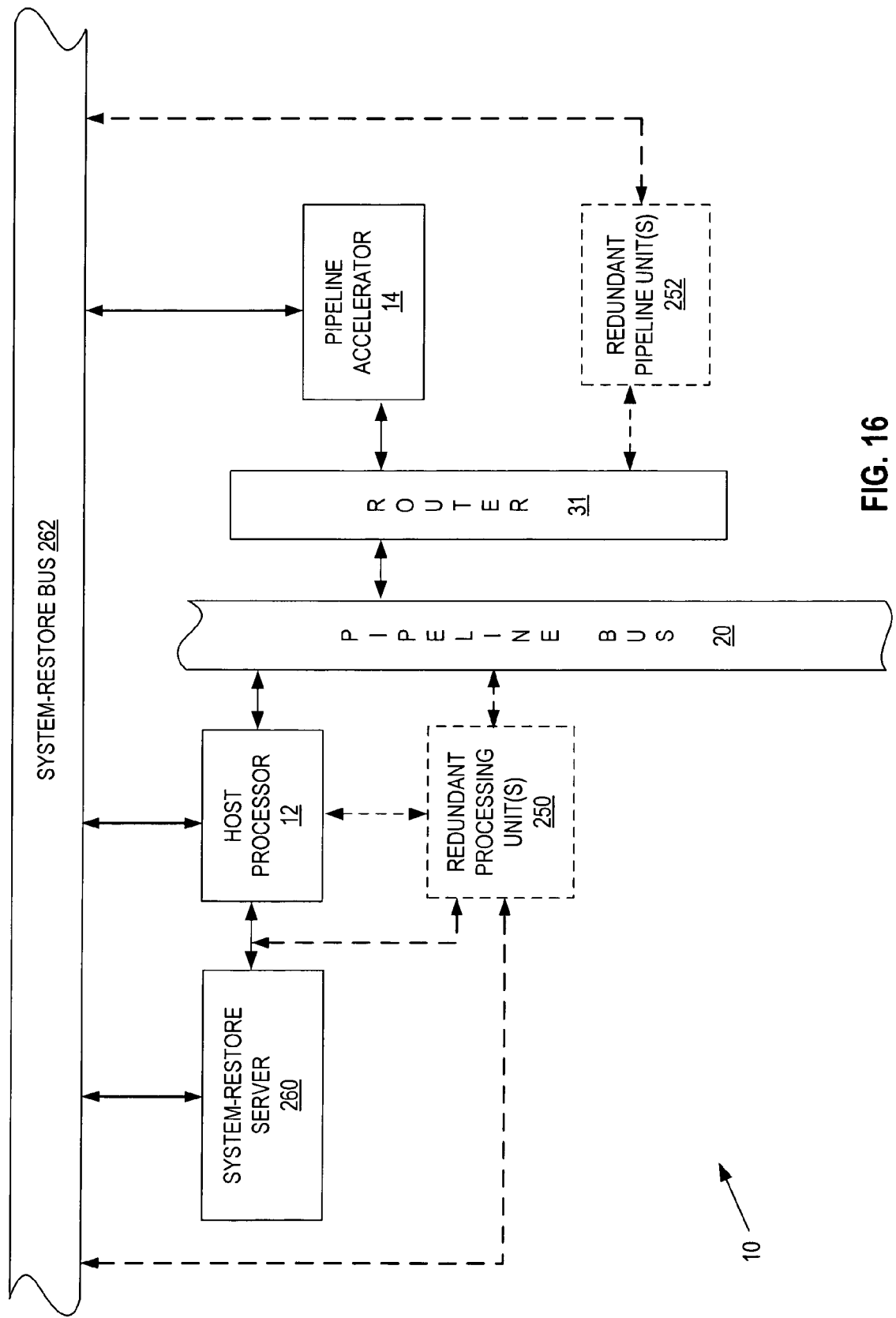
FIG. 16 is a block diagram of a peer-vector computing machine having a system-restore server and a system-restore bus according to an embodiment of the invention.

FIG. 16 is a block diagram of the peer-vector machine 10, which includes system-restore capabilities according to an embodiment of the invention. Generally, this embodiment of the machine 10 periodically saves the states of some or all of the, e.g., registers, within the host processor 12 and the pipeline accelerator 14. Therefore, in the event of a failure and a subsequent restart, the peer-vector machine 10 can respectively restore the last-saved states to the host processor 12 and to the pipeline accelerator 14 so as to reduce or eliminate the volume of pre-failure data that the machine must reprocess.

In addition to the host processor 12, the pipeline accelerator 14, the pipeline bus 20, the optional router 31, the optional redundant processing unit(s) 250, and the optional redundant pipeline unit(s) 254, this embodiment of the peer-vector machine 10 includes a system-restore server 260 and a system-restore bus 262.

During operation of the peer-vector machine 10, the registers and other data-storing components of the host processor 12 and the pipeline accelerator 14 (and the redundant processing unit(s) 250 and pipeline unit(s) 252 if present and in use) periodically "dump" their contents onto the system-restore server 260 via the system-restore bus 262. The separation of the system-restore bus 262 from the pipeline bus 20 reduces or eliminates a data-processing-speed penalty that this data dump may cause, and otherwise prevents a "bottleneck" on the bus 20.

After a dynamic reconfiguration but before a restart of the peer-vector machine 10, the host processor 12 causes the server 260 to upload the last-saved set of data into the respective registers and other data-storing components.

Therefore, after the restart, the peer-vector machine 10 starts processing data from the point in time of the last-dumped set of data, and thus reprocesses only the pre-failure data that it processed between the last data dump and the failure.

Consequently, by reducing the amount of pre-failure data that the peer-vector machine 10 reprocesses, the system-restore server 260 and the system-restore bus 262 provide a reduction in the overall data-processing time whenever the configuration manager 194 dynamically reconfigures and restarts the peer-vector machine.

Still referring to FIG. 16, other embodiments of the peer-vector machine 10 are contemplated. For example, the system-restore bus 262 may be omitted, and the host processor 12 and the pipeline accelerator 14 (and the redundant processing unit(s) 250 and the redundant pipeline units 252 if present and in use) dump data to the system-restore server 260 via the pipeline bus 20.

Figure 17:
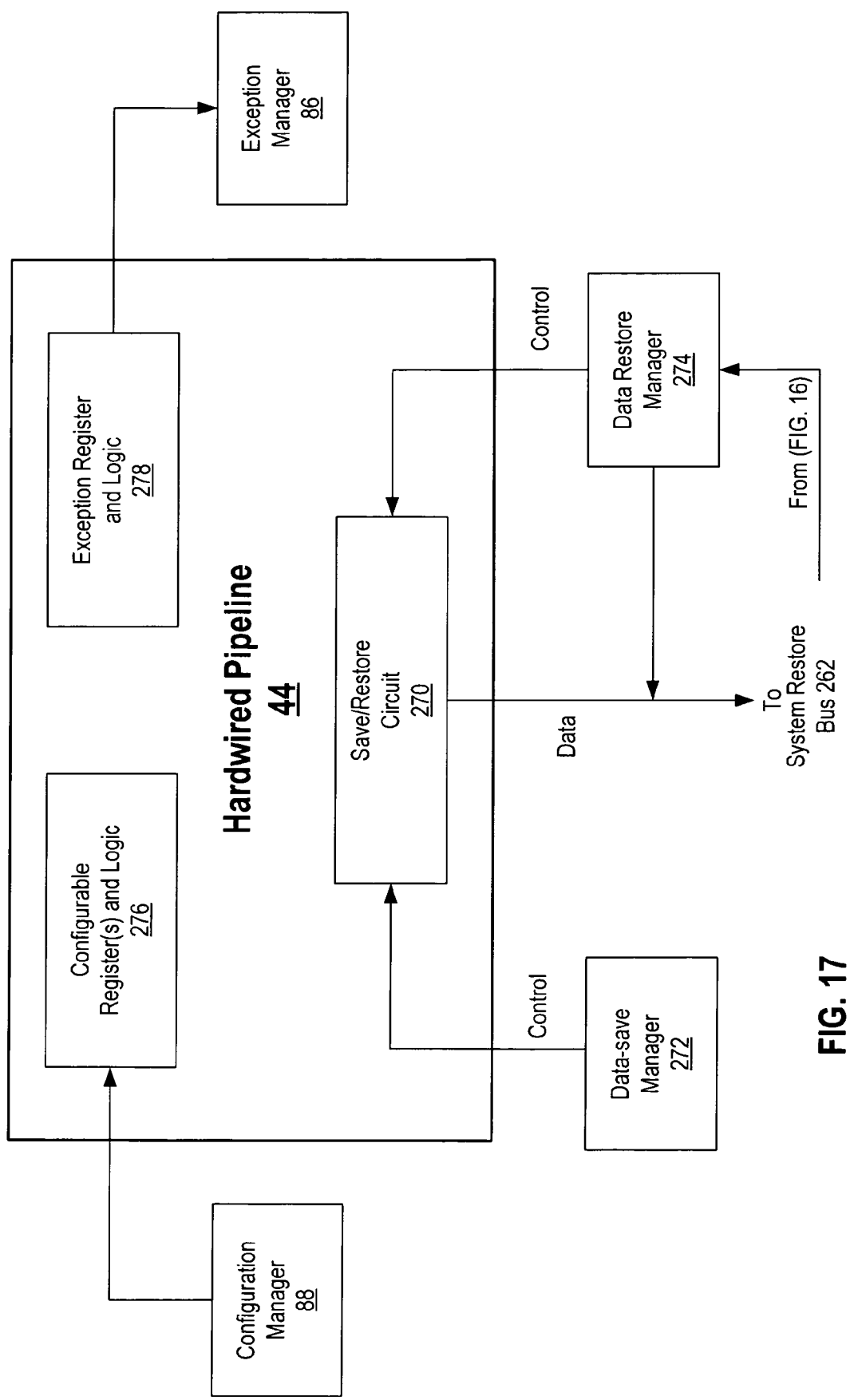
FIG. 17 is a block diagram of a hardwired pipeline that includes a save/restore circuit according to an embodiment of the invention.

FIG. 17 is a block diagram of a hardwired pipeline 44 that includes a save/restore circuit 270 according to an embodiment of the invention. The circuit 270 allows the pipeline 44 to periodically "dump" the data within the pipeline's working registers (not shown in FIG. 17), and to restore the dumped data, as discussed above in conjunction with FIGS. 15-16.

The save/restore circuit 270 is part of the framework-services layer 72 (FIGS. 2-3), and causes the working registers (not shown in FIG. 17) of the hardwired pipeline 44 to dump their data to the system-restore server 260 (FIG. 16) via the system-restore bus 262 under the control of a data-save manager 272, which is executed by the processing unit 32 of the host processor 12 (FIG. 10). The data-save manager 272 and the circuit 270 may communicate with one another by sending messages over the system-restore bus 262, or over the pipeline bus 20 (FIG. 16). Furthermore, the data-save manager 272 may be a part of the configuration manager 194 (FIG. 10), or the configuration manager 194 may perform the function(s) of the data-save manager.

During a system restore, the save/restore circuit 270 causes the working registers (not shown in FIG. 17) of the hardwired pipeline 44 to load saved data (typically the lasted-saved data) from the system-restore server 260 (FIG. 16) via the system-restore bus 262 under the control of a data-restore manager 274, which is executed by the processing unit 32 of the host processor 12 (FIG. 10). The data-restore manager 274 and the circuit 270 may communicate with one another by sending messages over the system-restore bus 262, or over the pipeline bus 20 (FIG. 16). Furthermore, the data-restore manager 274 may be a part of the configuration manager 194 (FIG. 10), or the configuration manager 194 may perform the function(s) of the data-restore manager.

In addition to the save/restore circuit 270, the hardwired pipeline 44 includes one or more configurable registers and logic 276, and one or more exception registers and logic 278. The configurable registers and logic 276 receive and store configuration data from the configuration manager 88 (see also FIG. 3), and use this stored configuration data to configure the pipeline 44 as previously described. The exception registers and logic 274 generate and store exception data in response to exceptions that occur during operation of the pipeline 44, and provide this data to the exception manager 86 (see also FIG. 3) for handling as previously described.

Still referring to FIG. 17, the operation of the hardwired pipeline 44 is described according to an embodiment of the invention.

During normal operation, the data-save manager 272 periodically causes the save/restore circuit 270 to dump the data from selected working registers (not shown in FIG. 17) within the hardwired pipeline 44 to the system-restore server 260 via the system-restore bus 262. Data within the configurable register(s) 276 typically selects which working registers dump their data, and the data may so select any number of the working registers. Alternatively, the data-save manager 272 may cause the save/restore circuit 270 to dump data from the selected working registers via the pipeline bus 20. Furthermore, if a data dump from one or more of the selected working registers fails, then the exception register(s) and logic 278 may send a corresponding exception to the exception manager 86. In response to such an exception, the configuration manager 194 may repeat the data-dump operation, at least for the hardwired pipeline(s) 44 that generate the exception.

During a system-restore operation, the data-restore manager 274 causes the save/restore circuit 270 to load previously dumped and saved data from the system-restore server 260 (FIG. 16) into the respective working registers (not shown in FIG. 17) within the hardwired pipeline 44 via the system-restore bus 262 or the pipeline bus 20. Before loading the data, the configuration manager 194 (FIG. 10) typically loads the configurable register(s) 276 with data that selects which working registers are to load data. Alternatively, data identifying the working registers which are to load restored data may have been previously stored in nonvolatile memory within the configuration register(s) and logic 276. The save/restore circuit 270 may then run a check to make sure that it properly loaded the restore data. If the check fails, then the exception register(s) and logic 278 may send a corresponding exception to the exception manager 86. In response to such an exception, the configuration manager 194 may repeat the system-restore operation, at least for the hardwired pipeline(s) 44 that generate the exception.

Figure 18:
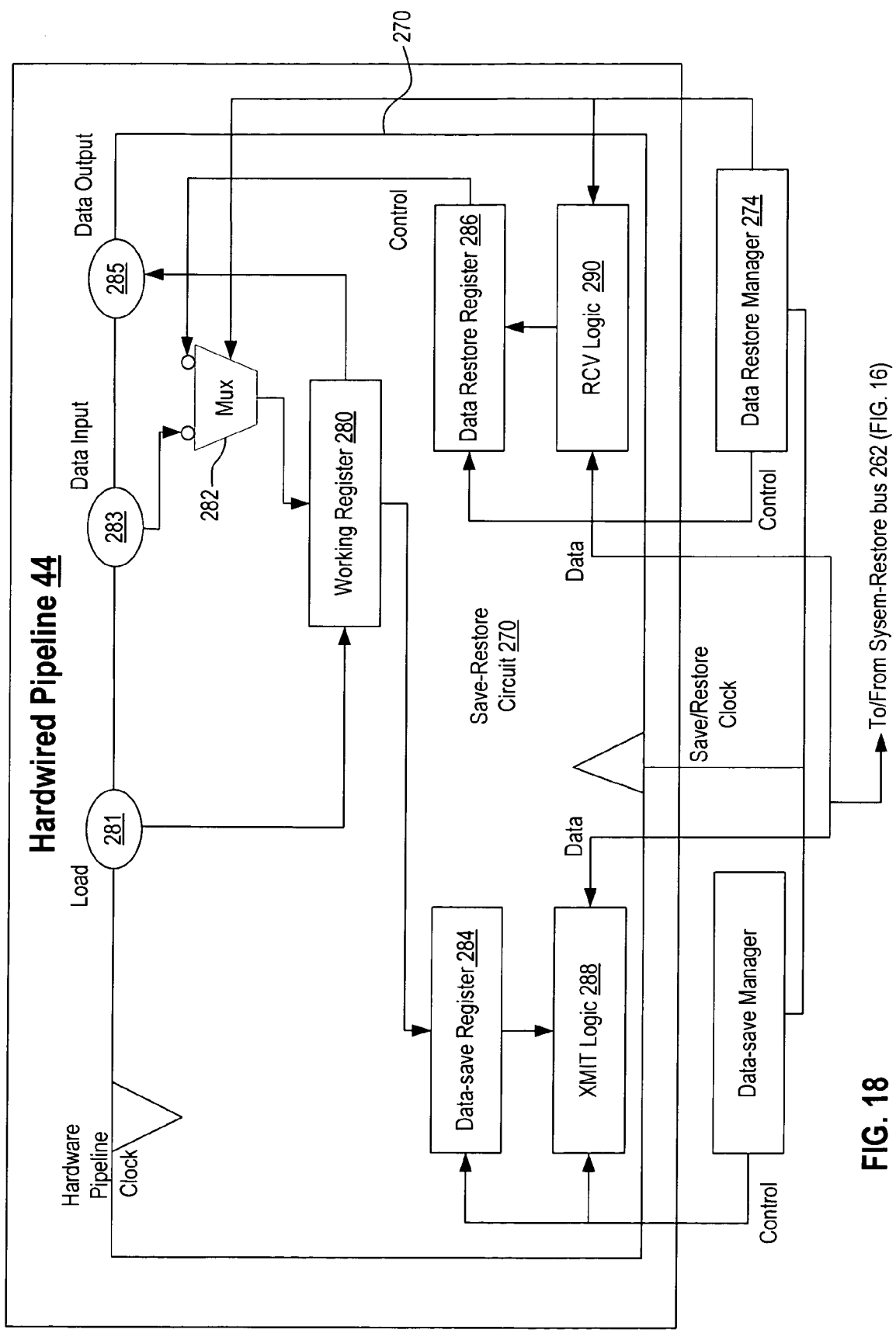
FIG. 18 is a more-detailed block diagram of the hardwired pipeline of FIG. 17 according to an embodiment of the invention.

FIG. 18 is a more-detailed block diagram of the hardwired pipeline 44 of FIG. 17 according to an embodiment of the invention.

In addition to the save-restore circuit 270, the hardwired pipeline 44 includes one or more working registers 280 (for clarity, only one working register is shown in FIG. 18), a respective input-data multiplexer 282 for each working register, a load port 281, a data-input port 283, and a data-output port 285.

The save-restore circuit 270 includes a respective data-save register 284 and a respective data-restore register 286 for each working register 280, saved-data transmit logic 288, and restored-data receive logic 290.

Still referring to FIG. 18, the operation of the hardwired pipeline 44 is described according to an embodiment of the invention.

During normal operation, the data-save manager 272 causes the data-save register 284 to download the data from the corresponding working register 280 during each predetermined number of cycles of the save-restore clock. The data-save manager 272 also causes the transmit logic 288 to transfer the data from the register 284 to the system-restore server 260 (FIG. 16), typically at the same rate at which the register 284 downloads data from the working register 280. Furthermore, the working register 280 may load data from the data-input port 283 via the multiplexer 282 in response to a hardwired-pipeline clock and a load command on the load port 281, and may provide data via the data-output port 285. Alternatively, the save-restore circuit 270 may include fewer data-save registers 284 than working registers 280, such that a single data-save register may serve multiple working registers, perhaps even all of the working registers within the pipeline 44. In such an alternative embodiment, such a data-save register 284 cooperates with the transmit logic 288 to download data from the corresponding working registers 280 in a serial fashion.

During a system-restore operation, the data-restore manager 274 causes the receive logic 290 to load previously saved data from the system-restore server 260 (FIG. 16) and into the data-restore registers 286 during each predetermined number of cycles of the save-restore clock. The data-restore manager 274 also causes each data-restore register 286 to load the previously saved data back into a respective working register 280 via a respective multiplexer 282. Once all of the working registers 280 are loaded with respective previously saved data, then the configuration manager 194 may return the hardwired pipeline 44 to normal operation. Alternatively, the save-restore circuit 270 may include fewer data-restore registers 286 than working registers 280, such that a single data-restore register may serve multiple working registers, perhaps all of the working registers in the pipeline 44. In such an alternative embodiment, such a data-restore register 286 cooperates with the receive logic 290 to upload data to the corresponding working registers 280 in a serial fashion.

Referring to FIGS. 1-18, alternate embodiments of the peer vector machine 10 are contemplated. For example, some or all of the components of the peer vector machine 10, such as the host processor 12 (FIG. 1) and the pipeline units 50 (FIG. 3) of the pipeline accelerator 14 (FIG. 1), may be disposed on a single integrated circuit.

The preceding discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

What is claimed is:

1. A computing machine, comprising:
    a pipeline bus operable to carry data;
    a system-restore bus that is separate from the pipeline bus;
    a pipeline accelerator operable to drive pipeline data onto the pipeline bus and to periodically drive onto the system-restore bus accelerator information representative of an operational data state of the pipeline accelerator;
    a host processor separate from the pipeline accelerator operable to drive host data onto the pipeline bus and to periodically drive onto the system-restore bus processor information representative of an operational data state of the host processor; and
    a redundant processor separate from the pipeline accelerator and separate from the host processor operable to receive one of the pipeline data and the host data from the pipeline bus and to receive one of the pipeline information and the processor information from the system-restore bus in response to a failure of a respective one of the host processor and the pipeline accelerator.

2. The computing machine of claim 1, further comprising:
    wherein the pipeline accelerator comprises a pipeline unit; and
    a redundant pipeline unit having a redundant programmable integrated circuit and coupled to the pipeline bus.

3. An electronic system, comprising:
    a computing machine, comprising,
        a pipeline bus,
        a system-restore bus that is separate from the pipeline bus,
        a pipeline accelerator coupled to the pipeline and system-restore busses,
        a host processor separate from the pipeline accelerator coupled to the pipeline and system-restore busses, and a redundant processor separate from the pipeline accelerator and separate from the host processor coupled to the pipeline and system-restore busses; and a system restorer coupled to the computing machine via the system-restore bus.

4. A computing machine, comprising:
i. a pipeline accelerator including a pipeline unit having a programmable-logic integrated circuit;
ii. a system-restore bus coupled to the pipeline accelerator and coupled to a system restorer, the system-restore bus separate from the pipeline unit;
iii. an instruction-executing host processor coupled to the pipeline accelerator; and
iv. a redundant pipeline unit separate from the pipeline accelerator and separate from the host processor coupled to the pipeline accelerator, to the system-restore bus and to the host processor and including a redundant programmable-logic integrated circuit.

5. A system, comprising:
a computing machine, comprising,
   a pipeline bus,
   a system-restore bus that is separate from the pipeline bus,
   a pipeline accelerator having a pipeline unit and coupled to the pipeline and system-restore busses,
   a host processor separate from the pipeline accelerator coupled to the pipeline and system-restore busses, and
   a redundant pipeline unit separate from the pipeline accelerator and separate from the host processor coupled to the pipeline and system-restore busses and to the host processor and including a redundant programmable integrated circuit; and
a system restorer coupled to the computing machine via the system-restore bus.

6. A computing machine, comprising:
a pipeline bus;
a system-restore bus that is separate from the pipeline bus;
a pipeline accelerator coupled to the pipeline and system-restore busses;
a host processor separate from the pipeline accelerator coupled to the pipeline and system-restore busses; and
a recovery device separate from the pipeline accelerator and separate from the host processor coupled to the system-restore bus and periodically operable to:
   save first data representing a data state of the pipeline accelerator during a respective predetermined period, and
   save second data representing a data state of the host processor during the respective predetermined period.

7. The computing machine of claim 6 wherein after a failure of the pipeline accelerator, the recovery device is further operable to restore to the pipeline accelerator the most recent first data.

8. The computing machine of claim 6 wherein after a failure of the pipeline accelerator, the recovery device is further operable to restore to the host processor the most recent second data.

9. The computing machine of claim 6 wherein after a failure of the host processor, the recovery device is further operable to restore to the pipeline accelerator the most recent first data.

10. The computing machine of claim 6 wherein after a failure of the host processor, the recovery device is further operable to restore to the host processor the most recent second data.

11. The computing machine of claim 6 wherein:
the pipeline bus is operable to carry data; and
the recovery device is coupled to the pipeline accelerator and to the host processor via the pipeline bus.

12. A system, comprising:
a computing machine, comprising,
   a pipeline bus;
   a system-restore bus that is separate from the pipeline bus;
   a pipeline accelerator coupled to the pipeline and system-restore busses,
   a host processor separate from the pipeline accelerator coupled to the pipeline and system-restore busses, and
   a recovery device separate from the pipeline accelerator and separate from the host processor coupled to the system-restore bus and operable to,
      periodically save first data representing a data state of the pipeline accelerator during a respective predetermined period, and
      periodically save second data representing a data state of the host processor during the respective predetermined period.

13. A method, comprising:
processing data with a programmable logic integrated circuit of a pipeline accelerator and with a host processor separate from the pipeline accelerator and coupled to the pipeline accelerator;
periodically retrieving an operational data state of the host processor via a system-restore bus that is separate from a data bus;
providing the operational data state of the host processor to a redundant processor via the system-restore bus if the host processor fails, the redundant processor separate from the pipeline accelerator and separate from the host processor coupled to the pipeline accelerator; and
processing the data with the pipeline accelerator and theredundant processor if the host processor fails.

14. A method, comprising:
processing data with a programmable logic integrated circuit of a pipeline accelerator and with a host processor separate from the pipeline accelerator and coupled to the pipeline accelerator;
periodically retrieving an operational data state of the programmable logic integrated circuit via a system-restore bus that is separate from a data bus;
providing the operational data state of the programmable logic integrated circuit to a redundant programmable logic integrated circuit separate from the pipeline accelerator and separate from the host processor via the system-restore bus if the programmable logic integrated circuit fails, the redundant programmable logic integrated circuit coupled to the pipeline accelerator and to the processor; and
processing the data with the redundant programmable logic integrated circuit if the programmable logic integrated circuit fails.

15. A method, comprising:
periodically saving via a system-restore bus first data representing a data state of a pipeline accelerator during a respective predetermined period, the system-restore bus separate from a data bus over which the host processor and pipeline accelerator transfer processed data; and
periodically saving via the system-restore bus second data representing a data state of a host processor during the respective predetermined period, the host processor being coupled to and separate from the pipeline accelerator.

16. The method of claim 15, further comprising restoring to the pipeline accelerator after a failure of the pipeline accelerator the most recent first data via the system-restore bus.

17. The method of claim 15, further comprising restoring to the host processor after a failure of the pipeline accelerator the most recent second data via the system-restore bus.

18. The method of claim 15, further comprising restoring to the pipeline accelerator after a failure of the host processor the most recent first data via the system-restore bus.

19. The method of claim 15, further comprising restoring to the host processor after a failure of the host processor the most recent second data via the system-restore bus.

\* \* \* \* \*